(12) United States Patent
Hirabayashi et al.

(10) Patent No.: US 7,619,256 B2
(45) Date of Patent: Nov. 17, 2009

(54) ELECTRO-OPTICAL DEVICE AND ELECTRONIC APPARATUS

(75) Inventors: Yukiya Hirabayashi, Suwa (JP); Takashi Sato, Tottori (JP)

(73) Assignee: Epson Imaging Devices Corporation, Azumino-shi (JP)

(*) Notice: Subject to any disclaimer, the term of this patent is extended or adjusted under 35 U.S.C. 154(b) by 322 days.

(21) Appl. No.: 11/730,287

(22) Filed: Mar. 30, 2007

(65) Prior Publication Data

US 2007/0262352 A1 Nov. 15, 2007

(30) Foreign Application Priority Data

Apr. 26, 2006 (JP) .............................. 2006-121642

(51) Int. Cl.
*H01L 27/14* (2006.01)
(52) U.S. Cl. .................. 257/72; 257/59; 257/E29.151; 438/151; 438/155
(58) Field of Classification Search ............... 257/59, 257/72, E29.151; 438/151, 155; 345/90–92
See application file for complete search history.

(56) References Cited

U.S. PATENT DOCUMENTS

| 5,521,107 | A | 5/1996 | Yamazaki et al. | |
| 6,395,586 | B1 * | 5/2002 | Huang et al. | 438/149 |
| 7,329,901 | B2 * | 2/2008 | Eguchi et al. | 257/59 |

FOREIGN PATENT DOCUMENTS

| JP | A 9-160070 | 6/1997 |
| JP | A-09-203912 | 8/1997 |
| JP | A 10-200125 | 7/1998 |
| JP | A-2000-131718 | 5/2000 |
| JP | B2 3106566 | 9/2000 |
| JP | A-2001-013520 | 1/2001 |
| JP | A 2004-45811 | 2/2004 |
| JP | A-2004-101615 | 4/2004 |
| JP | A 2005-217342 | 8/2005 |
| JP | A 2005-242306 | 9/2005 |
| JP | A 2006-39272 | 2/2006 |
| JP | A 2006-98641 | 4/2006 |
| JP | A 2006-106076 | 4/2006 |
| KR | 1996-0011185 B1 | 8/1996 |

* cited by examiner

*Primary Examiner*—Zandra V. Smith
*Assistant Examiner*—Paul E Patton
(74) *Attorney, Agent, or Firm*—Oliff & Berridge, PLC

(57) ABSTRACT

An electro-optical device includes an element substrate having a plurality of pixel regions; thin-film transistors, arranged in the pixel regions, including gate electrodes, portions of a gate insulating layer, and semiconductor layers; pixel electrodes electrically connected to drain regions of the thin-film transistors; and storage capacitors including lower electrodes and upper electrodes that are opposed to the lower electrodes with insulating layers disposed therebetween, the insulating layers being made of the same material as that for forming the gate insulating layer. The upper electrodes overlap with some of end portions of the lower electrodes. The gate insulating layer has thin portions located in inner portions of regions overlapping with the lower and upper electrodes and thick portions which are located in regions overlapping with the upper electrodes and the end portions of the lower electrodes and which have a thickness greater than that of the thin portions.

6 Claims, 16 Drawing Sheets

ELECTRO-OPTICAL DEVICE AND ELECTRONIC APPARATUS

BACKGROUND

1. Technical Field

The present invention relates to an electro-optical device including thin-film transistors and storage capacitors arranged above an element substrate and an electronic apparatus including the electro-optical device.

2. Related Art

Among various electro-optical devices is an active matrix-type liquid crystal device. In the liquid crystal device, a liquid crystal is held between an element substrate 10 shown in FIGS. 16A and 16B and a counter substrate (not shown). The element substrate 10 includes a plurality of pixel regions 1e corresponding to intersections of gate lines 3a (scanning lines) and source lines 6a (date lines). The pixel regions 1e include thin-film transistors 1c for switching pixels and pixel electrodes 2a electrically connected to drain regions 6b of the thin-film transistors 1c. The alignment of the liquid crystal is controlled for each pixel in such a manner that image signals are applied to the pixel electrodes 2a from the source lines 6a with the thin-film transistors 1c. The pixel regions 1e further include storage capacitors 1h including lower electrodes 3c and upper electrodes 6c, the lower electrodes 3c being portions of capacitor lines 3b, the upper electrodes 6c being extending portions of the drain regions 6b. The storage capacitors 1h further include dielectric layers 4c that are usually portions of a gate insulating layer 4 shared by the thin-film transistors 1c. An increase in the capacitance per unit area of the storage capacitors 1h enhances charge-holding properties thereof, reduces the occupancy area thereof, and increases the aperture ratio of the pixels.

In order to increase the capacitance per unit area of storage capacitors without reducing the dielectric strength of gate insulating layers shared by thin-film transistors, it has been attempted that the thickness of the gate insulating layers is increased and the thickness of dielectric layers is reduced.

For example, JP-A-9-160070 (hereinafter referred to as Patent Document 1) discloses that anodic oxide films on lower electrodes are used as dielectric layers of storage capacitors and a gate insulating layer has a multilayer structure including anodic oxide films on gate electrodes and a silicon nitride layer overlying upper electrodes.

JP-A-2005-217342 (hereinafter referred to as Patent Document 2) discloses that the following portions are used as dielectric layers of storage capacitors: thin portions that are formed in a gate insulating layer in such a manner that the gate insulating layer is partly removed by etching using a half-tone mask.

JP-A-2004-45811 (hereinafter referred to as Patent Document 3) discloses that a dielectric layer for forming storage capacitors is formed, regions for forming thin-film transistors are removed from the dielectric layer, and a gate insulating layer is then formed.

Japanese Patent No. 3106566 (hereinafter referred to as Patent Document 4) discloses a technique for forming top-gate thin-film transistors in which semiconductor layers, portions of a gate insulating layer, and gate electrodes are arranged in that order from the bottom. In this technique, a first insulating layer made of silicon dioxide is formed by the thermal oxidation of a semiconductor layer, the gate insulating layer is formed in such a manner that a second insulating layer made of silicon nitride is deposited on the first insulating layer by a chemical vapor deposition (CVD) process, and the second insulating layer is partly removed by etching in such a manner that portions of the gate insulating layer that overlap with channel regions are covered with a resist mask, whereby thin portions are formed in the gate insulating layer. The thin portions are used as dielectric layers of storage capacitors.

Patent Documents 1 to 4 describe the reduction of the thickness of the dielectric layers but contain no information about the reduction of the dielectric strength of portions of the dielectric layers having a reduced thickness, the portions being sandwiched between the upper electrodes and end portions of the lower electrodes. The end portions of the lower electrodes have a stepped shape and therefore the dielectric layers have stepped portions corresponding to the stepped shape. Therefore, when voltages are applied between the lower and upper electrodes, electric fields cannot be uniformly generated across the dielectric layers and therefore are concentrated on the end portions of the lower electrodes. This causes a reduction in dielectric strength or dielectric breakdown (short circuits). The growth direction and the deposition rate of the dielectric layers depend on the morphology of components disposed under the dielectric layers. Therefore, the dielectric layers have nonuniform regions which extend over the end portions of the lower electrodes and which have different properties. The nonuniform regions can cause a reduction in dielectric strength.

SUMMARY

An advantage of a aspect of the invention is to provide an electro-optical device in which even if dielectric layers of storage capacitors have a reduced thickness, regions overlapping with upper electrodes and end portions of lower electrodes can be prevented from being reduced in dielectric strength. An advantage of another aspect of the invention is to provide an electronic apparatus including the electro-optical device.

An electro-optical device according to the present invention includes an element substrate having a plurality of pixel regions; thin-film transistors, arranged in the pixel regions, including gate electrodes, portions of a gate insulating layer, and semiconductor layers; pixel electrodes electrically connected to drain regions of the thin-film transistors; and storage capacitors including lower electrodes and upper electrodes that are opposed to the lower electrodes with insulating layers disposed therebetween, the insulating layers being made of the same material as that for forming the gate insulating layer. The upper electrodes overlap with some of end portions of the lower electrodes. The gate insulating layer has thin portions located in inner portions of regions overlapping with the lower and upper electrodes and thick portions which are located in regions overlapping with the upper electrodes and the end portions of the lower electrodes and which have a thickness greater than that of the thin portions.

Since the thin portions are located in the inner portions of the regions overlapping with the lower and upper electrodes, the storage capacitors have high capacitance per unit area. Dielectric layers of the storage capacitors have a small thickness and the thick portions of the gate insulating layer are located in the regions overlapping with the upper electrodes and the end portions of the lower electrodes. Hence, electric field concentration due to stepped portions can be mitigated by the thick portions of the gate insulating layer and therefore the dielectric strength of the end portions of the lower electrodes is prevented from being reduced. Even if electric fields are concentrated on portions of the dielectric layers that are located between the upper electrodes and the end portions of the lower electrodes because the dielectric layers have a stepped shape due to the stepped portions corresponding to the end portions of the lower electrodes, dielectric breakdown does not occur because the portions of the dielectric layers have a large thickness. Even if portions of the dielectric layers that cover the end portions of the lower electrodes are non-uniform because the growth direction and the deposition rate of the gate insulating layer depend on the morphology of components disposed under the gate insulating layer, neither a reduction in dielectric strength nor dielectric breakdown (short circuits) occurs because these portions of the dielectric layers have a large thickness. A reduction in the thickness of the dielectric layers will cause the above problems. According to the present invention, although the dielectric layers have a small thickness, the problems can be prevented. That is, although the thickness of the dielectric layers is reduced such that the storage capacitors have increased capacitance per unit area, the storage capacitors can be formed so as to have high dielectric strength.

In the electro-optical device, the gate electrodes, the gate insulating layer portions, and the semiconductor layers may be arranged in the thin-film transistors in that order.

In the electro-optical device, the thin portions are preferably located outside the regions overlapping with the upper electrodes and the end portions of the lower electrodes. This allows the thin portions to have an increased area; hence, the storage capacitors have increased capacitance per unit area. In regions other than the regions overlapping with the upper electrodes and the end portions of the lower electrodes, electric field concentration due to the stepped portions and the deterioration of film quality do not occur at the end portions of the upper electrodes and therefore the dielectric strength of the storage capacitors is not reduced.

In the electro-optical device, the thick portions preferably extend inward from the end portions of the lower electrodes and have a width greater than the thickness of the thick portions. If conditions are set as described above, electric field concentration due to the stepped portions and a reduction in dielectric strength due to the deterioration of film quality can be prevented. If the thin portions are expanded within a range satisfying such conditions, the capacitance per unit area of the storage capacitors can be increased.

In the electro-optical device, it is preferable that the gate insulating layer include a lower gate insulating sublayer including one or more insulating layer sections and a upper gate insulating sublayer including one or more insulating layer sections, the thin portions be formed by partly removing the lower gate insulating sublayer, and the thick portions correspond to portions in which the upper gate insulating sublayer is disposed on the lower gate insulating sublayer. According to this configuration, the upper gate insulating sublayer and the semiconductor layers can be continuously formed; hence, the interfaces between the upper gate insulating sublayer and the semiconductor layers can be maintained clean. This enhances the reliability of the thin-film transistors. The thin portions of the gate insulating layer are used as the dielectric layers of the storage capacitors, that is, the dielectric layers include no portions of the lower gate insulating sublayer but portions of the upper gate insulating sublayer 4b; hence, the gate insulating layer need not be partly removed in the thickness direction thereof by etching. This prevents the capacitance of the storage capacitors from being varied due to differences in etching depth. Since the lower gate insulating sublayer is partly removed and the upper gate insulating sublayer is used to form the dielectric layers of the storage capacitors, the upper gate insulating sublayer is not exposed to static electricity or plasma when the lower gate insulating sublayer is partly removed by dry etching. This protects the upper gate insulating sublayer from surface damage or defects. The upper gate insulating sublayer is not in contact with an etching solution for etching the lower gate insulating sublayer; hence, no pinholes are formed in the upper gate insulating sublayer. This prevents the reduction of the dielectric strength of the storage capacitors.

In the electro-optical device, the lower gate insulating sublayer may include an insulating layer section and the upper gate insulating sublayer includes an insulating layer section.

In the electro-optical device, the semiconductor layers are preferably made of amorphous silicon.

An electronic apparatus according to the present invention includes the electro-optical device. Examples of the electronic apparatus include mobile phones and mobile computers.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 16A:
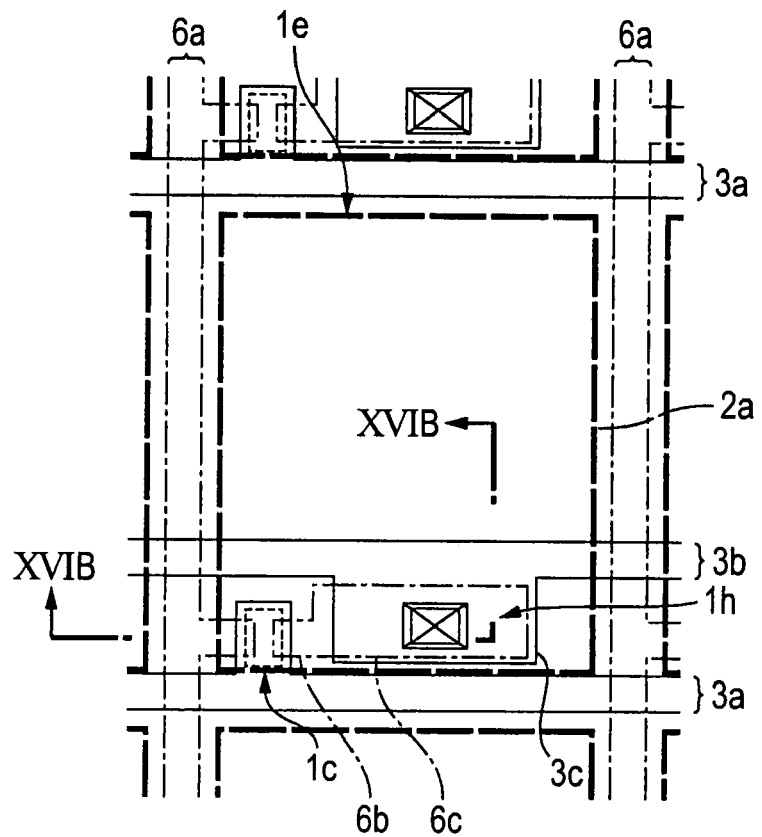
FIG. 16A is a plan view of one of pixels disposed in a known electro-optical device and FIG. 16B is a sectional view of the pixel taken along the line XVIB-XVIB of FIG. 16A.
Figure 16B:
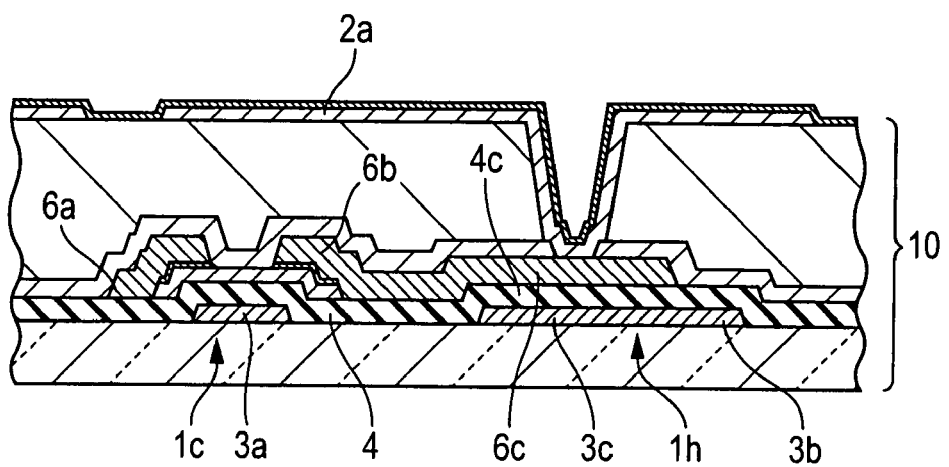

Embodiments of the present invention will now be described with reference to the accompanying drawings. In the drawings, in order to show layers and members on a recognizable scale, different scales are used depending on the size of the layers and members. Some of components described below have functions similar to those of components shown in FIG. 16. The components with similar functions have the same reference numerals and will not be described in detail.

First Embodiment

Figure 1A:
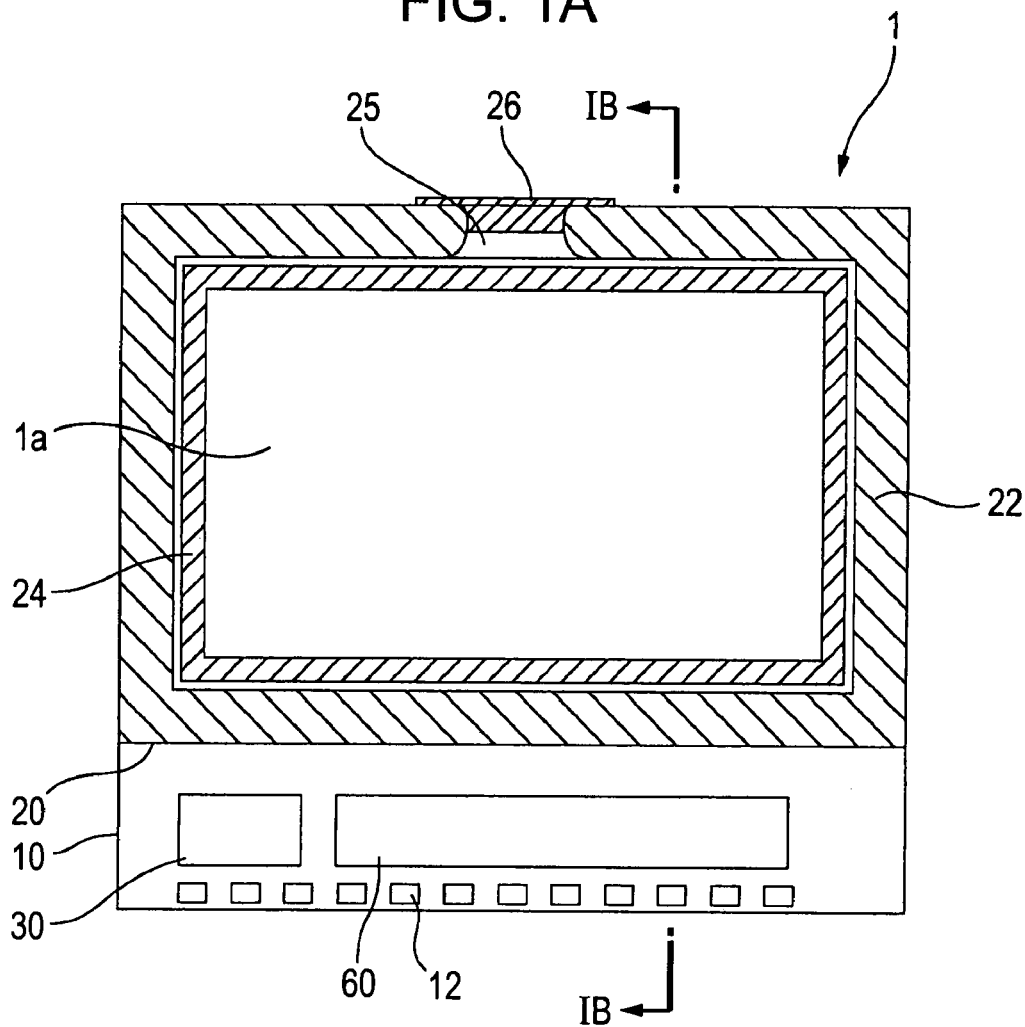
FIG. 1A is a plan view of an electro-optical device according to a first embodiment of the present invention and FIG. 1B is a sectional view of the electro-optical device 1 taken along the line IB-IB of FIG. 1A.
Figure 1B:
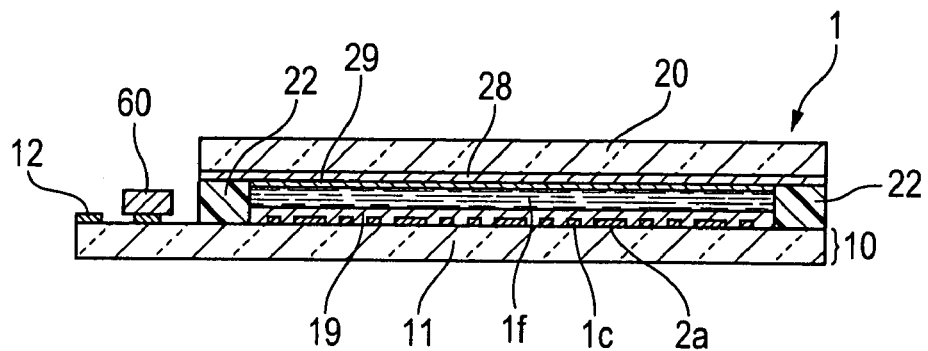

An electro-optical device 1 according to a first embodiment of the present invention will now be described. FIG. 1A shows the electro-optical device 1 in plan view and FIG. 1B shows the electro-optical device 1 in sectional view taken along the line IB-IB of FIG. 1A. The electro-optical device 1 is a transmissive active matrix liquid crystal device operating in a twisted nematic (TN) mode, an electrically controlled birefringence (ECB) mode, or a vertical aligned nematic (VAN) mode. The electro-optical device 1 includes an element substrate 10 and a counter substrate 20 that is bonded to the element substrate 10 with a sealing member 22 disposed therebetween. A liquid crystal 1f is held between the element and counter substrates 10 and 20. The element substrate 10 has an end region located outside of the sealing member 22. A data line-driving integrated circuit (IC) 60 and a scanning line-driving IC 30 are mounted on the end region of the element substrate 10 by a chip-on-glass (COG) method. Surface mount terminals 12 are arranged along a side of the element substrate 10. The sealing member 22 contains an adhesive, containing a photocurable or thermosetting resin, for bonding the element and counter substrates 10 and 20 together and also contains gap spacers such as glass fibers or glass beads. A liquid crystal injection port 25 is located between both ends of the sealing member 22. After the injection of the liquid crystal 1f is finished, the liquid crystal injection port 25 is sealed with a sealant 26.

Thin-film transistors 1c and pixel electrodes 2a are arranged above the element substrate 10 in a matrix pattern and a first alignment layer 19 extends over the thin-film transistors 1c and the pixel electrodes 2a as described below in detail. The counter substrate 20 includes a frame 24 (not shown in FIG. 1B) which is made of a light-shielding material and which is located inside the sealing member 22. An image display region 1a is located inside the frame 24. The counter substrate 20 further includes a light-shielding layer (not shown) called a black matrix or a black stripe. The light-shielding layer has portions located in regions opposed to boundary regions between pixels 1b. A counter electrode 28 and a second alignment layer 29 are arranged under the light-shielding layer. A protective layer and color filters 27 that are Red (R), green (G), or blue (B) are arranged in a region of the counter substrate 20 that is opposed to the pixels 1b disposed in the element substrate 10, the protective layer and the color filters 27 being not shown in FIG. 1B. This allows the electro-optical device 1 to be used as a color display for electronic apparatuses such as mobile computers, mobile phones, and liquid crystal televisions.

Figure 2:
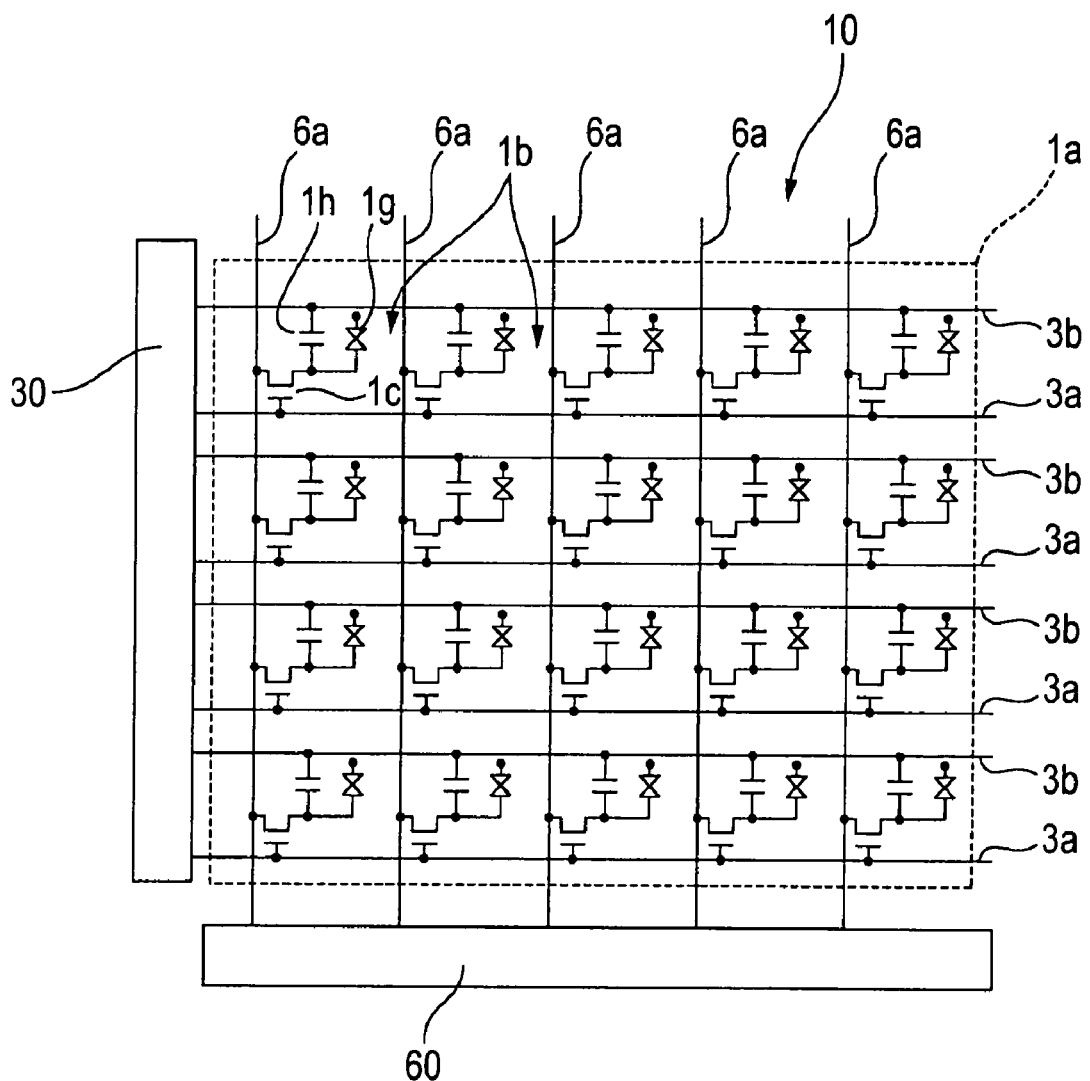
FIG. 2 is an illustration showing the electrical configuration of an element substrate included in the electro-optical device of the first embodiment.

The element substrate 10 will now be described in detail. FIG. 2 shows the electrical configuration of the element substrate 10. With reference to FIG. 2, the element substrate 10 has a region corresponding to the image display region 1a. Source lines (data lines) 6a and gate lines (scanning lines) 3a are arranged in this region such that the source lines 6a intersect with the gate lines 3a. The pixels 1b are located at positions corresponding to intersections of the source and gate lines 6a and 3a. The gate lines 3a extend from the scanning line-driving IC 30 and the source lines 6a extend from the data line-driving IC 60. The element substrate 10 includes thin-film transistors 1c, individually arranged for each pixel 1b, for controlling the operation of the liquid crystal 1f. The source lines 6a and the gate lines 3a are electrically connected to the source electrodes and gate electrodes, respectively, of the thin-film transistors 1c.

The element substrate 10 further includes capacitor lines 3b extending in parallel to the gate lines 3a. In this embodiment, the thin-film transistors 1c are electrically connected to liquid crystal capacitors 1g, disposed between the element and counter substrates 10 and 20, in series. The liquid crystal capacitors 1g are electrically connected to storage capacitors 1h in parallel. The capacitor lines 3b are electrically connected to the scanning line-driving IC 30 and maintained at a constant potential. The storage capacitors 1h may be arranged between the gate lines 3a. In this case, the capacitor lines 3b can be omitted.

In the electro-optical device 1, image signals are supplied to the liquid crystal capacitors 1g through the source lines 6a at predetermined timing by turning on the thin-film transistors 1c for a predetermined period. The image signals are stored in the liquid crystal capacitors 1g for a predetermined period and maintained at a predetermined level. The storage capacitors 1h prevent the image signals from leaking from the liquid crystal capacitors 1g.

Figure 3A:
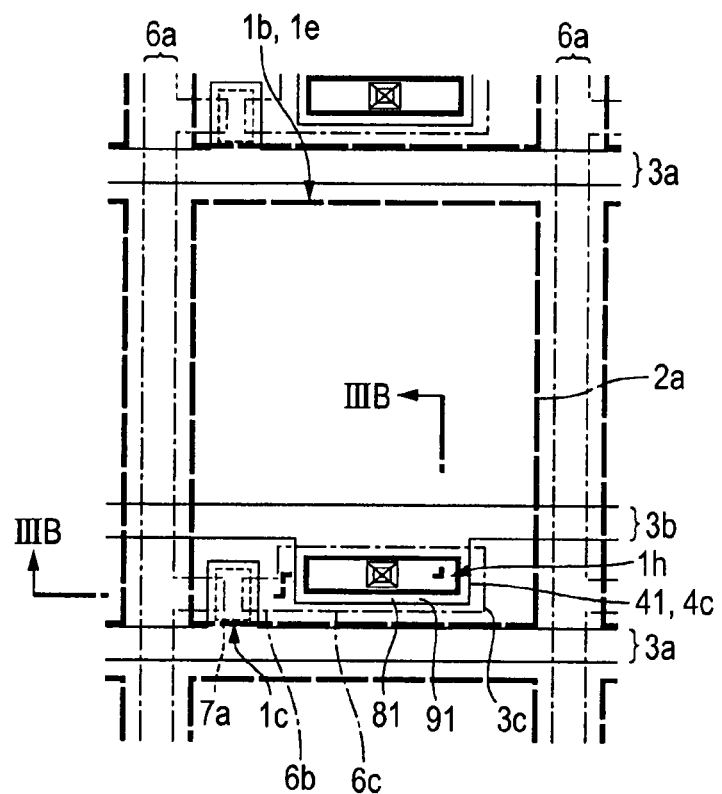
FIG. 3A is a plan view of one of pixels disposed in the electro-optical device of the first embodiment and FIG. 3B shows the pixel 1b in sectional view taken along the line IIIB-IIIB of FIG. 3A.
Figure 3B:
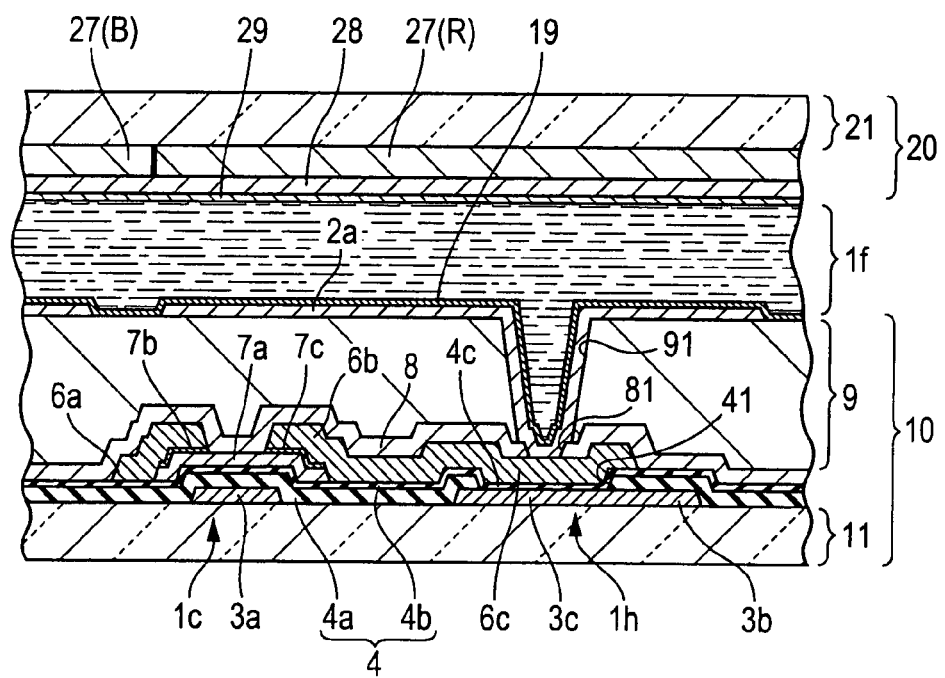

The pixels 1b will now be described in detail. FIG. 3A shows one of the pixels 1b disposed in the electro-optical device 1 in plan view and FIG. 3B shows the pixel 1b in sectional view taken along the line IIIB-IIIB of FIG. 3A. With reference to FIG. 3A, the pixel electrodes 2a are shown by thick broken lines, the gate lines 3a and thin-films formed together therewith are shown by thin solid lines, the source lines 6a and thin-films formed together therewith are shown by thin dotted-chain lines, and semiconductor layers 7a are shown by thin dotted lines. Furthermore, dielectric layers 4c of the storage capacitors 1h that are thin portions of a gate insulating layer 4 are shown by thick solid lines and contact holes as well as the gate lines 3a are shown by thin solid lines.

With reference to FIG. 3A, the element substrate 10 has pixel regions 1e surrounded by the gate and source lines 3a and 6a. The pixel regions 1e have components of the pixels 1b as described below. The pixel regions 1e have the semiconductor layers 7a, made of amorphous silicon, for forming active layers for forming the thin-film transistors 1c. Projective portions of the gate lines 3a serve as the gate electrodes of the thin-film transistors 1c. End portions of the source lines 6a are disposed on source-side end portions of the semiconductor layers 7a so as to serve as the source electrodes of the thin-film transistors 1c. The drain electrodes 6b of the thin-film transistors 1c are disposed on drain-side end portions of the semiconductor layers 7a. The capacitor lines 3b extend in parallel to the gate lines 3a.

The pixel regions 1e have the storage capacitors 1h. The storage capacitors 1h include lower electrodes 3c that are projective portions of the capacitor lines 3b and upper electrodes 6c that are extending portions of the drain electrodes 6b. The upper electrodes 6c are electrically connected to the pixel electrodes 2a through first contact holes 81 and second contact holes 91. The pixel electrodes 2a are made of indium tin oxide (ITO).

The element substrate 10 has a cross section as shown in FIG. 3B. The element substrate 10 includes an insulating plate 11 made of glass or quartz. The insulating plate 11 underlies the gate lines 3a (gate electrodes) made of a conductive material and the capacitor lines 3b (the lower electrodes 3c of the storage capacitors 1h). The gate lines 3a and the capacitor lines 3b have a two-layer structure and each include an aluminum alloy layer which contains neodymium and which has a thickness of about 150 nm and a molybdenum layer which is disposed on the neodymium-aluminum alloy layer and which has a thickness of about 20 nm.

In this embodiment, the gate insulating layer 4 extends over the gate lines 3a. The upper face of the gate insulating layer 4 has regions overlapping with the projective portions of the gate lines 3a (gate electrodes). The semiconductor layers 7a are arranged in these regions. The semiconductor layers 7a have source regions and drain regions. The source regions are overlaid with the source lines 6a and first ohmic contact layers 7b made of doped silicon and the drain regions are overlaid with the drain electrodes 6b and second ohmic contact layers 7c made of doped silicon. The thin-film transistors 1c are configured with these components. The extending portions of the drain electrodes 6b are used as the upper electrodes 6c of the storage capacitors 1h. The semiconductor layers 7a have a thickness of about 150 nm and are made of intrinsic amorphous silicon. The first and second ohmic contact layers 7b and 7c have a thickness of about 50 nm and are made of $n^+$ amorphous silicon doped with phosphorus. The source lines 6a and the drain electrodes 6b (upper electrodes 6c) have a three-layer structure and each include a 5-nm thick molybdenum layer, a 1,500-nm thick aluminum layer, and a 50-nm thick molybdenum layer, these layers being arranged in that order from the bottom.

A passivation layer 8 made of silicon nitride and a planarization layer 9 made of a photosensitive resin such as an acrylic resin are arranged on the source lines 6a, the drain electrodes 6b, and the upper electrodes 6c in that order. The passivation layer 8 and the planarization layer 9 serve as interlayer insulating layers. The pixel electrodes 2a are arranged on the planarization layer 9. The planarization layer 9 has the second contact holes 91 and the passivation layer 8 has the first contact holes 81. The pixel electrodes 2a are electrically connected to the upper electrodes 6c through the first and second contact holes 81 and 91 and also electrically connected to the drain regions of the thin-film transistors 1c with the upper electrodes 6c and the drain electrodes 6b. The pixel electrodes 2a are overlaid with the first alignment layer 19. The passivation layer 8 has a thickness of about 250 nm and is made of silicon nitride and the pixel electrodes 2a have a thickness of about 100 nm and are made of ITO.

The counter substrate 20 is opposed to the element substrate 10 configured as described above. The liquid crystal 1f is held between the element and counter substrates 10 and 20. The counter substrate 20 includes the color filters 27, the counter electrode 28, and the second alignment layer 29. The liquid crystal capacitors 1g are located between the counter electrode 28 and the pixel electrodes 2a as shown in FIG. 2. The counter substrate 20 may further include a black matrix or a protective layer, which are not shown.

Figure 4A:
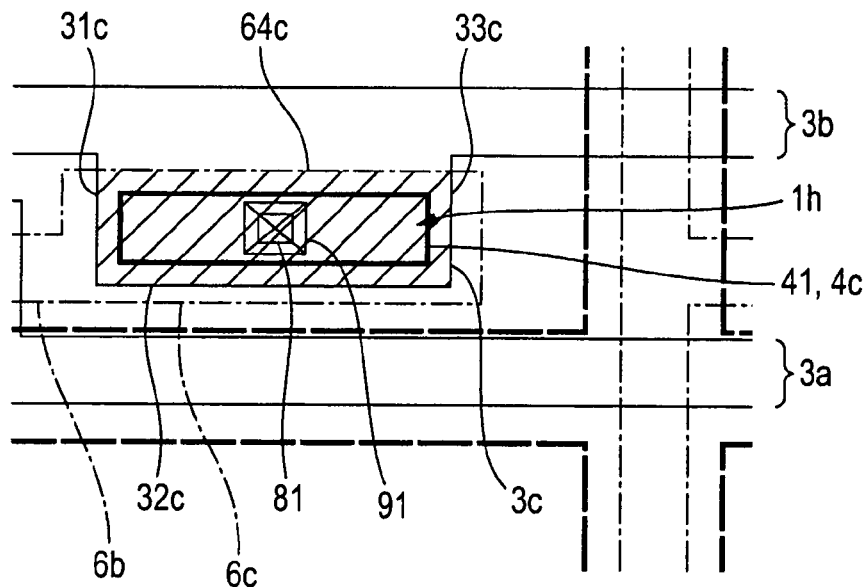
FIG. 4A is an enlarged plan view of one of storage capacitors included in the electro-optical device of the first embodiment.
Figure 4B:
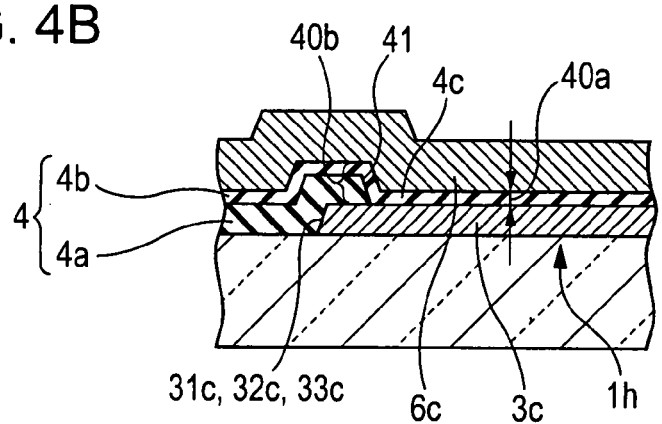
FIG. 4B is an enlarged sectional view of one of regions overlapping with end portions of lower electrodes and upper electrodes.
Figure 4C:
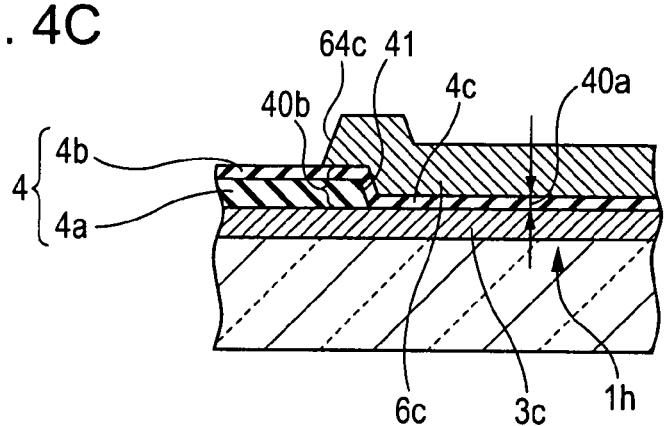
FIG. 4C is an enlarged sectional view of one of regions overlapping with the lower electrodes and end portions of the upper electrodes, the lower and upper electrodes being included in the storage capacitors.

The gate insulating layer 4 and the storage capacitors 1h will now be described in detail. FIG. 4A shows one of the storage capacitors 1h in plan view in an enlarged manner, FIG. 4B shows one of regions overlapping with end portions of the lower electrodes 3c and the upper electrodes 6c in sectional view in an enlarged manner, and FIG. 4C shows one of regions overlapping with the lower electrodes 3c and end portions of the upper electrodes 6c in sectional view in an enlarged manner. With reference to FIG. 4A, one of regions overlapping with the lower electrodes 3c and the upper electrodes 6c is diagonally shaded.

With reference to FIGS. 3A, 3B, and 4A, the gate insulating layer 4 has a two-layer structure and includes a thick lower gate insulating sublayer 4a made of silicon nitride and a thin upper gate insulating sublayer 4b made of silicon nitride. The lower gate insulating sublayer 4a has such a thickness that the influence of the parasitic capacitance of the thin-film transistors 1c is small. The upper gate insulating sublayer 4b has a thickness less than that of the lower gate insulating sublayer 4a. For example, the lower gate insulating sublayer 4a preferably has a thickness of about 250 to 500 nm and more preferably about 300 nm. The upper gate insulating sublayer 4b preferably has a thickness of about 50 to 200 nm and more preferably about 100 nm. The thickness of the lower and upper gate insulating sublayers 4a and 4b is optimally determined in consideration of the writing speed and parasitic capacitance of the thin-film transistors 1c and the balance of the storage capacitors 1h. When the pixels 1b has a small size (for example, the pixels 1b have short sides with a length of 40 μm or less) to achieve high resolution, the storage capacitors 1h and liquid crystal capacitors 1g in the pixels 1b have a small size. The minimum size of the thin-film transistors 1c depends on the resolution of photolithography. Therefore, the percentage of the parasitic capacitance of the thin-film transistors 1c in the capacitance of the pixels 1b is high. It is known that an increase in the percentage of the parasitic capacitance (hereinafter referred to as parasitic capacitance percentage) causes flicker, crosstalk, and/or image-sticking to deteriorate the display quality of the electro-optical device 1. Therefore, the parasitic capacitance percentage is usually designed to be as small as possible. When the parasitic capacitance percentage is limited due to high-resolution layout, it is difficult to improve the parasitic capacitance percentage by a conventional technique. However, if a structure or process described herein is used, portions of the gate insulating layer 4 that are located in the thin-film transistors 1c can be controlled in thickness independently of other portions of the gate insulating layer 4 that are located in the storage capacitors 1h. That is, in the pixels 1b, the parasitic capacitance of the thin-film transistors 1c can be reduced and therefore the parasitic capacitance percentage can be reduced in such a manner that conditions for forming the gate insulating layer 4 are set such that the gate insulating layer 4 has a thickness greater than that of ordinary interlayer insulating layers. For the sake of such conditions, the ability of the thin-film transistors 1c to drive currents (the ability of the thin-film transistors 1c to write signals in the pixels 1b) is low; however, the pixels 1b have reduced capacitance. Hence, the writing ability of the thin-film transistors 1c can be designed not to be reduced by an increase in the thickness of the gate insulating layer 4.

In the gate insulating layer 4, the lower gate insulating sublayer 4a has openings 41 formed by removing the following regions from the lower gate insulating sublayer 4a in the thickness direction: regions overlapping with the lower and upper electrodes 3c and 6c of the storage capacitors 1h in plan view. In contrast, the upper gate insulating sublayer 4b has no opening. Therefore, the gate insulating layer 4 has thin portions 40a which are located in the regions overlapping with the lower and upper electrodes 3c and 6c in plan view (regions overlapping with the openings 41 in plan view) which are portions of the upper gate insulating sublayer 4b. The gate insulating layer 4 also has thick portions 40b in which the upper gate insulating sublayer 4b is disposed on the lower gate insulating sublayer 4a. That is, in the storage capacitors 1h, the thin portions 40a of the gate insulating layer 4 are used as the dielectric layers 4c.

In the storage capacitors 1h configured as described above, the extending portions (upper electrodes 6c) of the drain electrodes 6b have a rectangular shape and partly protrude from the projective portions (lower electrodes 3c) of the capacitor lines 3b that have a rectangular shape. Therefore, the upper electrodes 6c each overlap with a first end portion 31c, second end portion 32c, and third first end portion 33c of each lower electrode 3c that correspond to three sides thereof. With reference to FIG. 4B, the gate insulating layer 4 has stepped portions corresponding to the first, second, and third end portions 31c, 32c, and 33c of the lower electrodes 3c. Electric fields may be concentrated on the stepped portions of the gate insulating layer 4 or properties of the gate insulating layer 4 may be deteriorated due to the presence of the stepped portions.

In this embodiment, in order to prevent such problems, the openings 41 are each located in a region spaced inward from the first, second, and third end portions 31c, 32c, and 33c of each lower electrode 3c at a predetermined distance. Therefore, the thin portions 40a, which include portions of the upper gate insulating sublayer 4b only, are located inner portions of the regions overlapping with the lower and upper electrodes 3c and 6c and the thick portions 40b, in which the upper gate insulating sublayer 4b is disposed on the lower gate insulating sublayer 4a, are adjacent to regions overlapping with the upper electrodes 6c and the first, second, and third end portions 31c, 32c, and 33c of the lower electrodes 3c. Therefore, even if electric fields are concentrated on the stepped portions of the gate insulating layer 4 or properties of the gate insulating layer 4 are deteriorated due to the presence of the stepped portions, the storage capacitors 1h is protected from dielectric breakdown because of the presence of the thick portions 40b of the gate insulating layer 4.

In this embodiment, the thick portions 40b, in which the upper gate insulating sublayer 4b is disposed on the lower gate insulating sublayer 4a, are also adjacent to end portions 64c of the regions overlapping with the lower electrodes 3c and the upper electrodes 6c as shown in FIG. 4C.

A method for manufacturing the electro-optical device 1 will now be described. FIGS. 5A to 5G and 6A to 6D are sectional views showing steps of preparing the element substrate 10. Although the element substrate 10 is usually prepared from a large wafer for manufacturing a large number of substrates, the element substrate 10 is described below as such a large wafer.

Figure 5A:
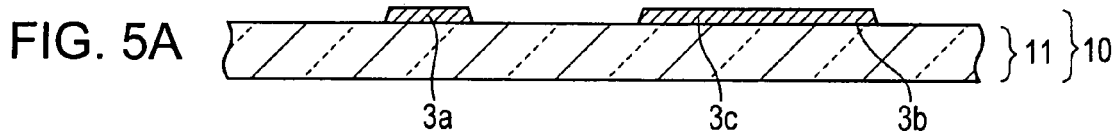
FIGS. 5A to 5G are sectional views showing steps of preparing an element substrate included in the electro-optical device of the first embodiment.

In a gate electrode-forming step shown in FIG. 5A, a metal layer is formed on the insulating plate 11, such as a glass plate, having a large size and then patterned by photolithography, whereby the gate lines 3a (gate electrodes) and the capacitor lines 3b (lower electrodes 3c) are simultaneously formed. The metal layer has a multilayer structure and includes an aluminum alloy sublayer having a thickness of about 150 nm and a molybdenum sublayer having a thickness of about 20 nm.

Figure 5B:
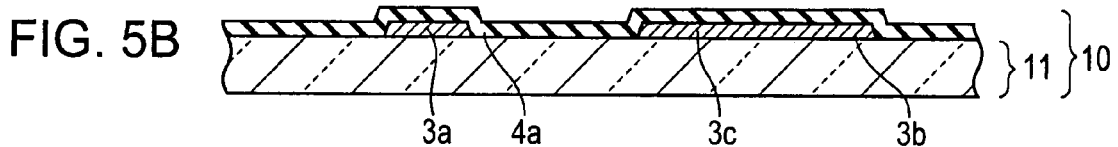

In a lower gate insulating sublayer-forming step shown in FIG. 5B, the lower gate insulating sublayer 4a of the gate insulating layer 4 is formed by a plasma-enhanced CVD process. The lower gate insulating sublayer 4a is made of silicon nitride and has a thickness of about 300 nm.

Figure 5C:
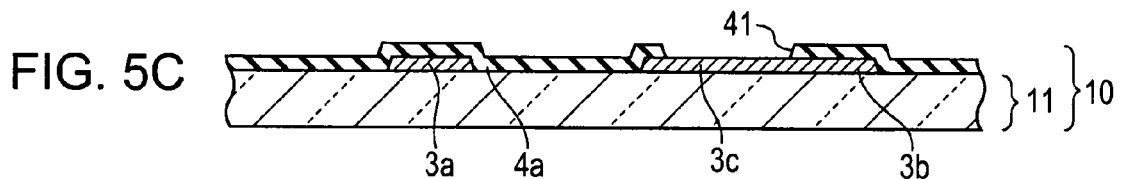

In the lower gate insulating sublayer-etching step, as shown in FIG. 5C, a resist mask (not shown) is formed on the lower gate insulating sublayer 4a so as to have apertures which overlap with the lower electrodes 3c in plan view and which are formed by photolithography and the lower gate insulating sublayer 4a is then subjected to reactive ion etching (dry etching) using a fluorine-containing etching gas such as $SF_6$, whereby the openings 41 are formed. This type of reactive ion etching uses the synergy of physical sputtering by ions and chemical etching by radicals and therefore is high in anisotropy and producibility.

Figure 5D:
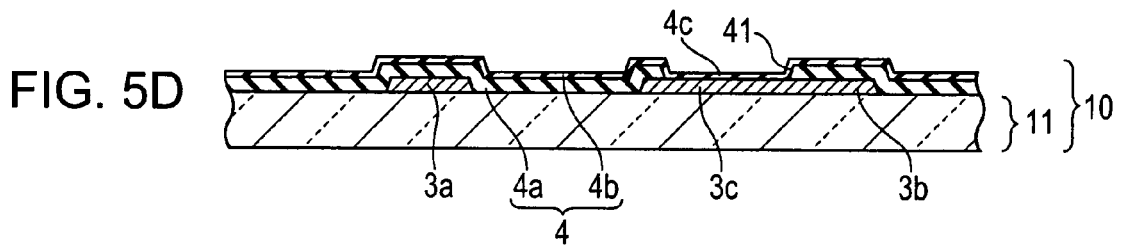

In an upper gate insulating sublayer-forming step shown in FIG. 5D, the upper gate insulating sublayer 4b of the gate insulating layer 4 is formed by a plasma-enhanced CVD process. The upper gate insulating sublayer 4b is made of silicon nitride and has a thickness of about 100 nm. As a result, the gate lines 3a (gate electrodes) are overlaid with the gate insulating layer 4 which includes thick lower gate insulating sublayer 4a and thin upper gate insulating sublayer 4b, while the dielectric layers 4c are located in regions that overlap with the openings 41 in plan view.

Figure 5E:
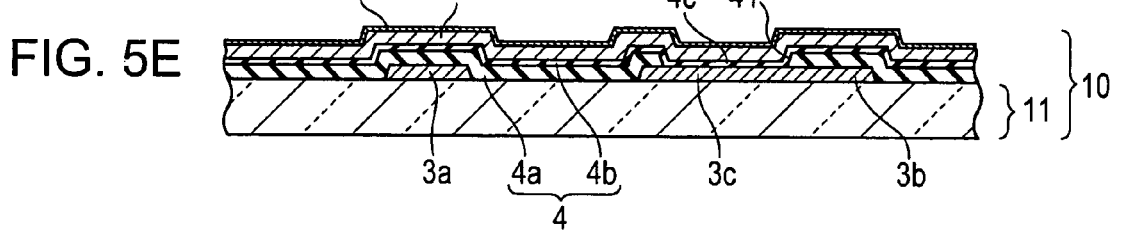

In a semiconductor layer-forming step shown in FIG. 5E, an intrinsic amorphous silicon layer 7d with a thickness of about 150 nm and then an $n^+$ silicon layer 7e with a thickness of about 50 nm are continuously formed by a plasma-enhanced CVD process. In this step, The element substrate 10 subjected to the upper gate insulating sublayer-forming step is kept in a vacuum atmosphere so as not to be in contact with air. This allows the amorphous silicon layer 7d to be deposited on a clean surface of the gate insulating layer 4 (upper gate insulating sublayer 4b).

Figure 5F:
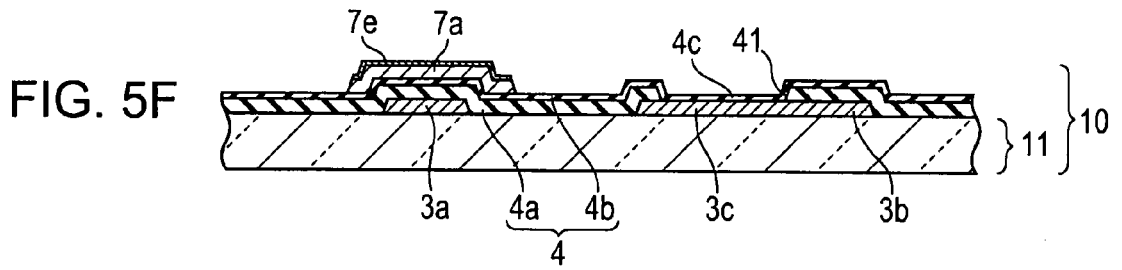

As shown in FIG. 5F, the amorphous silicon layer 7d and the $n^+$ silicon layer 7e are etched by photolithography, whereby the dotted semiconductor layers 7a and dotted $n^+$ silicon layers 7e, respectively, are formed. In this step, reactive ion etching (dry etching) is performed using a fluorine-containing etching gas such as $SF_6$.

Figure 5G:
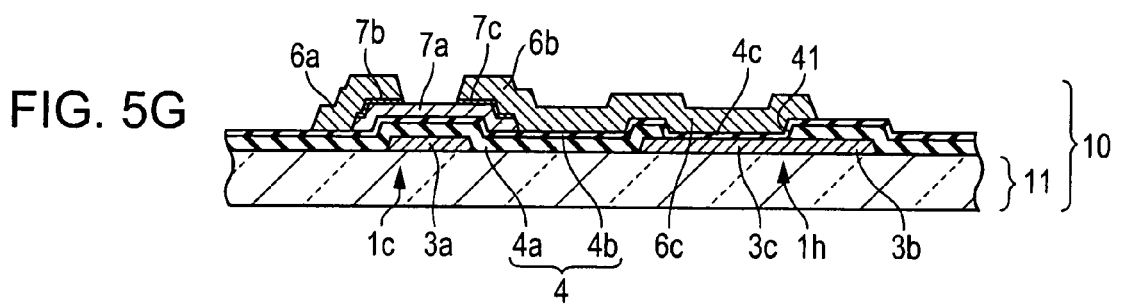

As shown in FIG. 5G, a metal layer including a 5-nm thick molybdenum sublayer, a 1,500-nm thick aluminum sublayer, and a 50-nm thick molybdenum sublayer is formed and patterned by photolithography, whereby the source lines 6a, the drain electrodes 6b, and the upper electrodes 6c are formed. Portions of the dotted $n^+$ silicon layers 7e that are located between the source lines 6a and the drain electrodes 6b are etched off in such a manner that the source lines 6a and the drain electrodes 6b are used as masks, whereby source-drain isolation is performed. This allows the first and second ohmic contact layers 7b and 7c to be formed because the portions of the dotted $n^+$ silicon layers 7e that are uncovered from he source lines 6a and the drain electrodes 6b are removed. In this operation, surface portions of the semiconductor layers 7a are etched. This allows the storage capacitors 1h and the thin-film transistors 1c, which has a bottom-gate structure, to be formed.

Figure 6A:
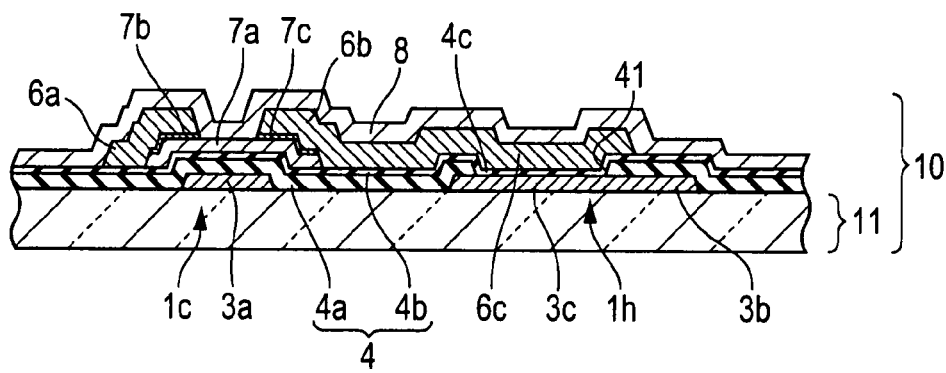
FIGS. 6A to 6D are sectional views showing steps of preparing the element substrate.

As shown in FIG. 6A, the passivation layer 8 which is made of silicon nitride and which has a thickness of about 250 nm is formed by a plasma-enhanced CVD process.

Figure 6B:
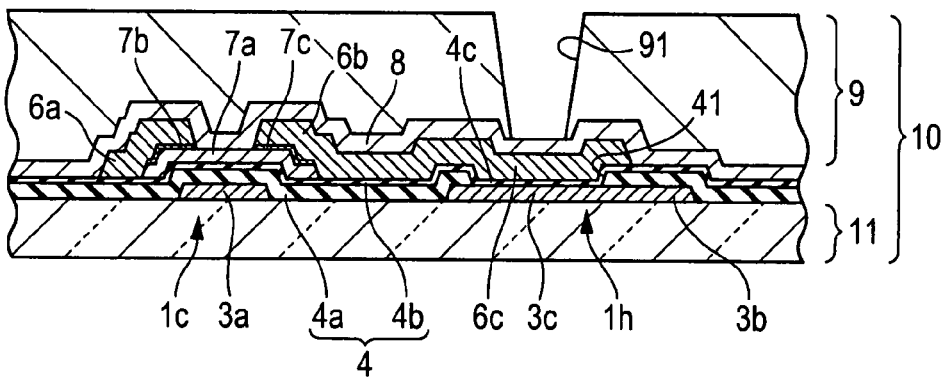

As shown in FIG. 6B, a photosensitive resin such as an acrylic resin is applied to the passivation layer 8 by a spin-coating process, exposed, and then developed, whereby the planarization layer 9 having the second contact holes 91 is formed.

Figure 6C:
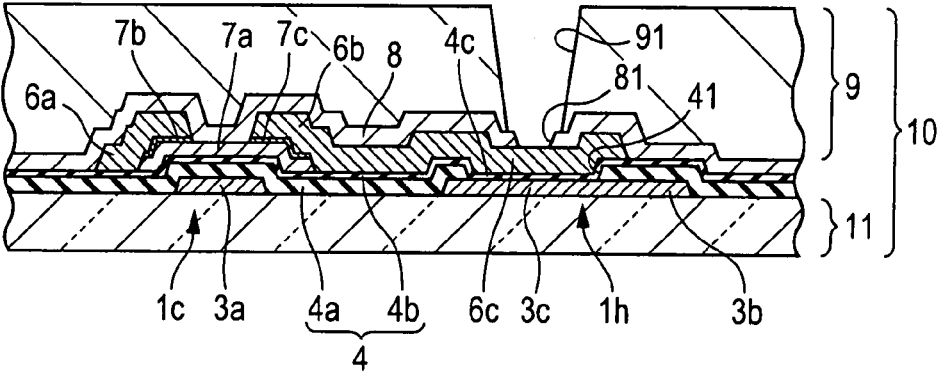

As shown in FIG. 6C, the passivation layer 8 is etched by photolithography, whereby the first contact holes 81 are formed at positions corresponding to the second contact holes 91. In this step, reactive ion etching (dry etching) is performed using a fluorine-containing etching gas such as $SF_6$.

Figure 6D:
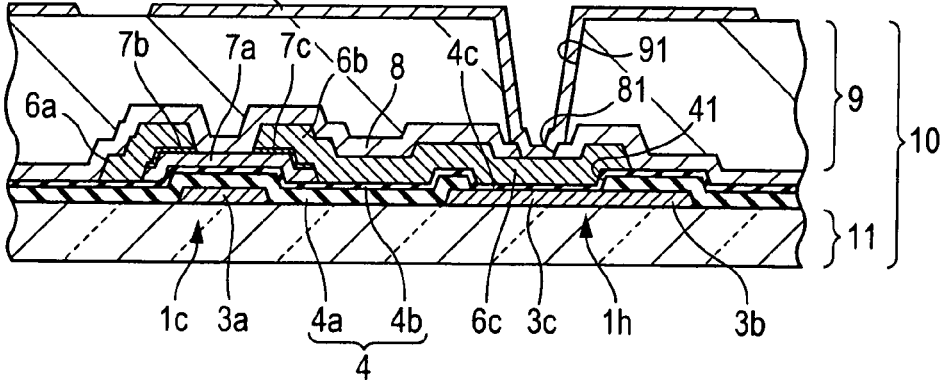

As shown in FIG. 6D, an ITO layer with a thickness of about 100 nm is formed by a sputtering process and then patterned by wet etching, whereby the pixel electrodes 2a are formed. The pixel electrodes 2a are electrically connected to the upper electrodes 6c through the first and second contact holes 81 and 91. A polyimide layer is formed and then rubbed, whereby the first alignment layer 19 shown in FIG. 3 is obtained.

The element substrate 10 which has a large size and which includes various wires and TFTs is bonded to the counter substrate 20, which has been prepared separately, with the sealing member 22. The element and counter substrates 10 and 20 are cut so as to have a predetermined size. This allows the liquid crystal injection port 25 to be formed. The liquid crystal 1f is injected between the element and counter substrates 10 and 20 through the liquid crystal injection port 25 and the liquid crystal injection port 25 is then sealed with the sealant 26.

Advantages of this embodiment will now be described. In the electro-optical device 1, the thin-film transistors 1c are configured to have such a bottom-gate structure as described above; hence, the following layers can be formed continuously in this order: the upper gate insulating sublayer 4b, the amorphous silicon layer 7d for forming the active layers (semiconductor layers 7a), and the $n^+$ silicon layer 7e for forming the first and second ohmic contact layers 7b and 7c. Therefore, the amorphous silicon layer 7d can be formed on the upper gate insulating sublayer 4b that is kept clean. Since The element substrate 10 is kept in a vacuum atmosphere during the formation of the upper gate insulating sublayer 4b, the amorphous silicon layer 7d, and the first and second ohmic contact layers 7b and 7c, the upper gate insulating sublayer 4b can be protected from surface contamination. Hence, the interfaces between the gate insulating layer 4 and the semiconductor layers 7a are clean and the thin-film transistors 1c have high reliability.

The dielectric layers 4c of the storage capacitors 1h have a thickness that is one fourth of the thickness of the gate insulating layer 4; hence, the capacitance per unit area of dielectric layers 4c is four times greater than that of the gate insulating layer 4. The upper gate insulating sublayer 4b for forming the dielectric layers 4c is made of silicon nitride (a dielectric constant of about seven to eight) and therefore has a dielectric constant greater than that of silicon dioxide layers; hence, the storage capacitors 1h have high capacitance per unit area. If the occupancy area of the storage capacitors 1h is reduced by an amount corresponding to an increase in the capacitance per unit area of the storage capacitors 1h having high charge-holding properties, the aperture ratio of the pixels 1b can be increased.

In this embodiment, the thin portions 40a of the gate insulating layer 4 are used as the dielectric layers 4c of the gate insulating layer 4, that is, the dielectric layers 4c include no portions of the lower gate insulating sublayer 4a but portions of the upper gate insulating sublayer 4b. Therefore, the capacitance of the storage capacitors 1h can be prevented from being varied due to differences in etching depth.

In this embodiment, the lower gate insulating sublayer 4a are partly removed and portions of the upper gate insulating sublayer 4b that are located on the lower gate insulating sublayer 4a are used as the dielectric layers 4c. The upper gate insulating sublayer 4b is not exposed to static electricity or plasma when the lower gate insulating sublayer 4a is partly removed by dry etching. Hence, the upper gate insulating sublayer 4b has low defect density. Accordingly, the occurrence of problems such as a reduction in the dielectric strength of the storage capacitors 1h can be prevented.

In this embodiment, since the openings 41 are located in the regions spaced inward from the first, second, and third end portions 31c, 32c, and 33c of the lower electrodes 3c that overlap with the upper electrodes 6c at a predetermined distance, the thick portions 40b in which the upper gate insulating sublayer 4b is disposed on the lower gate insulating sublayer 4a are adjacent to the regions overlapping with the upper electrodes 6c and the first, second, and third end portions 31c, 32c, and 33c of the lower electrode 3c. Therefore, although the gate insulating layer 4 has the stepped portions corresponding to the first, second, and third end portions 31c, 32c, and 33c of the lower electrodes 3c, the concentration of electric fields on the stepped portions can be reduced by the thick portions 40b of the gate insulating layer 4. Furthermore, although properties of the gate insulating layer 4 may be deteriorated due to the presence of the stepped portions, the dielectric strength of the storage capacitors 1h can be prevented from being reduced.

In this embodiment, the openings 41 are formed by dry-etching the lower gate insulating sublayer 4a. The openings 41 may be formed by wet-etching the lower gate insulating sublayer 4a. The upper gate insulating sublayer 4b is not in contact with an etching solution for etching the lower gate insulating sublayer 4a; hence, no pinholes are formed in the upper gate insulating sublayer 4b. This prevents the storage capacitors 1h from having different dielectric strengths.

Figure 7A:
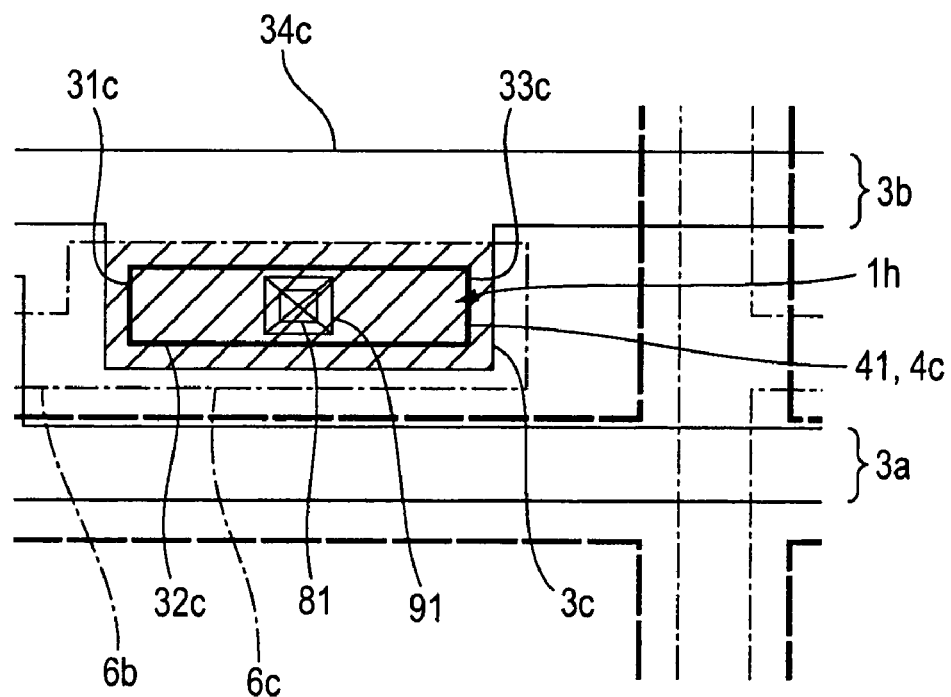
FIG. 7A is an enlarged plan view of one of the storage capacitors and FIG. 7B is an enlarged sectional view of one of the regions overlapping with the end portions of the lower electrodes and the upper electrodes.

A condition set in this embodiment will now be described. FIG. 7A shows one of the storage capacitors 1h, shown in FIG. 3, in plan view in an enlarged manner and FIG. 7B shows one of the regions overlapping with the end portions of the lower electrodes 3c and the upper electrodes 6c in sectional view in an enlarged manner.

Figure 7B:
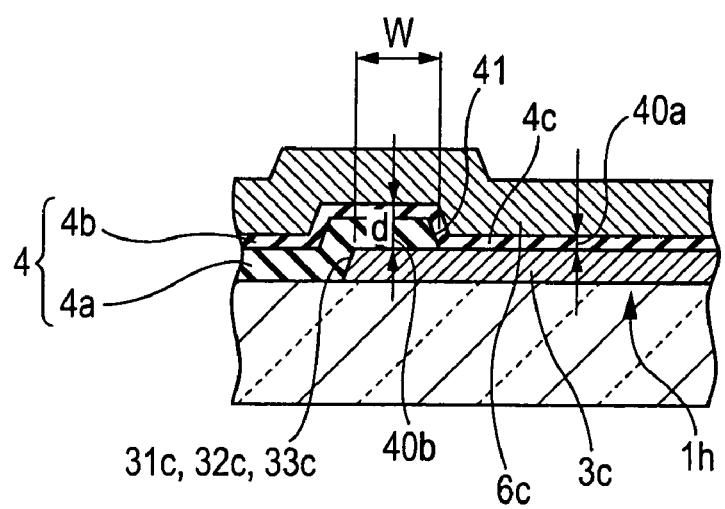

With reference to FIGS. 7A and 7B, the openings 41 are located in the regions spaced inward from the first, second, and third end portions 31c, 32c, and 33c of the lower electrodes 3c that overlap with the upper electrodes 6c at a predetermined distance. The thick portions 40b in which the upper gate insulating sublayer 4b is disposed on the lower gate insulating sublayer 4a are adjacent to the regions overlapping with the upper electrodes 6c and the first, second, and third end portions 31c, 32c, and 33c of the lower electrode 3c. The distance W from the openings 41 to the first, second, and third end portions 31c, 32c, and 33c of the lower electrodes 3c is preferably greater than or equal to the thickness d of the thick portions 40b.

According to this condition, electric fields can be prevented from being concentrated on the stepped portions corresponding to the first, second, and third end portions 31c, 32c, and 33c of the lower electrodes 3c and the dielectric strength of the storage capacitors 1h can be prevented from being reduced due to the deterioration of properties of the gate insulating layer 4. If the size of the thin portions 40a is increased within a range satisfying this condition, the capacitance per unit area of the storage capacitors 1h can be increased. This condition can be applied to all embodiments described below.

Second Embodiment

Figure 8A:
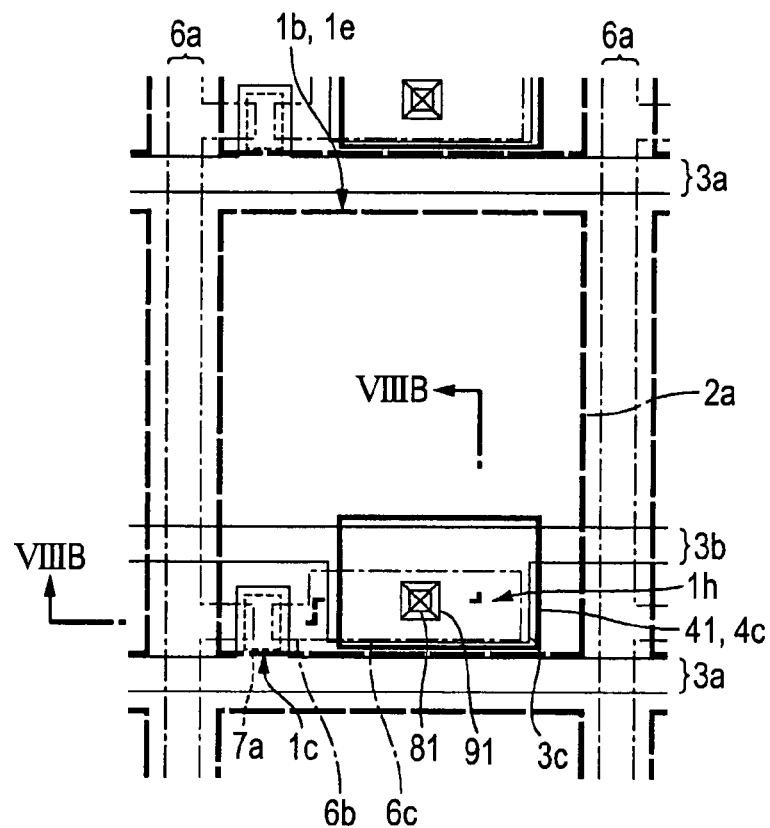
FIG. 8A is a plan view of one of pixels disposed in an electro-optical device according to a second embodiment of the present invention and FIG. 8B is a sectional view of the pixel taken along the line VIIIB-VIIIB of FIG. 8A.
Figure 8B:
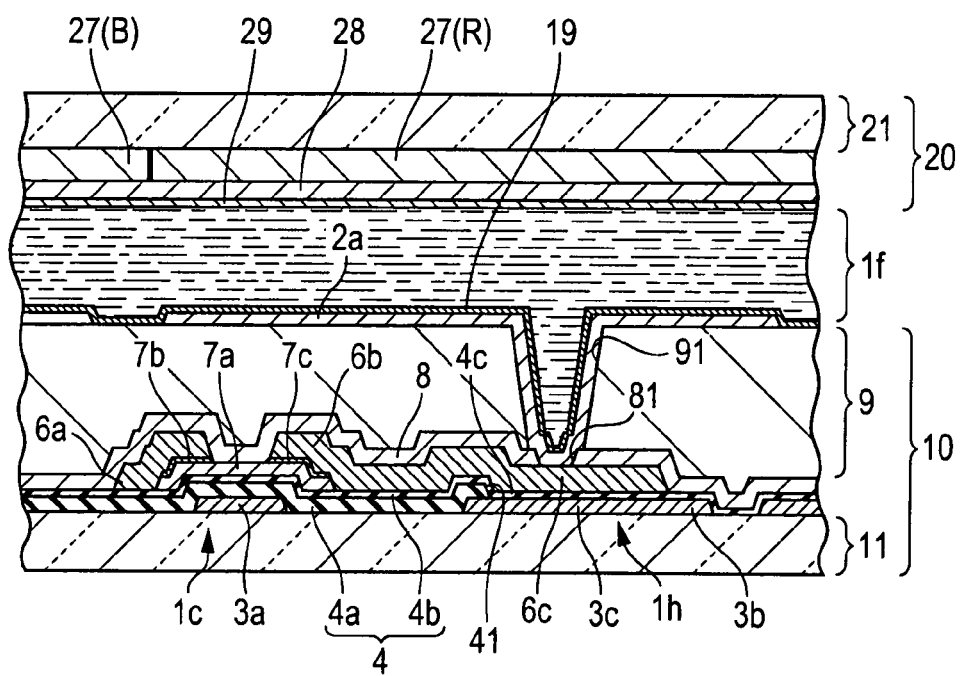
Figure 9A:
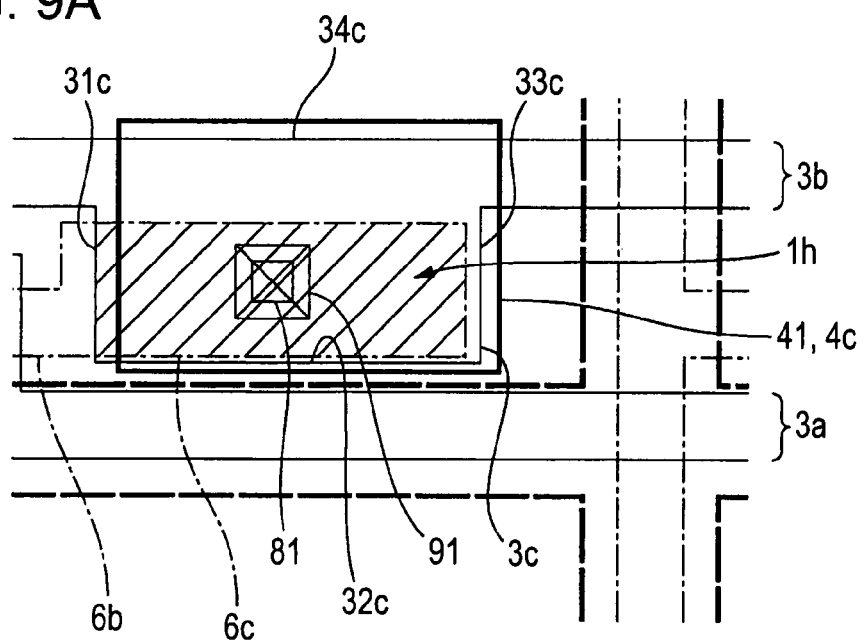
FIG. 9A is an enlarged plan view of one of storage capacitors included in the electro-optical device of the second embodiment.
Figure 9B:
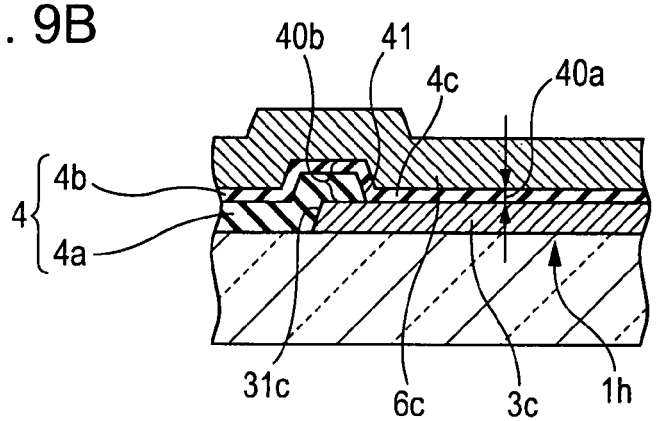
FIG. 9B is an enlarged sectional view of one of regions overlapping with end portions of lower electrodes and upper electrodes.
Figure 9C:
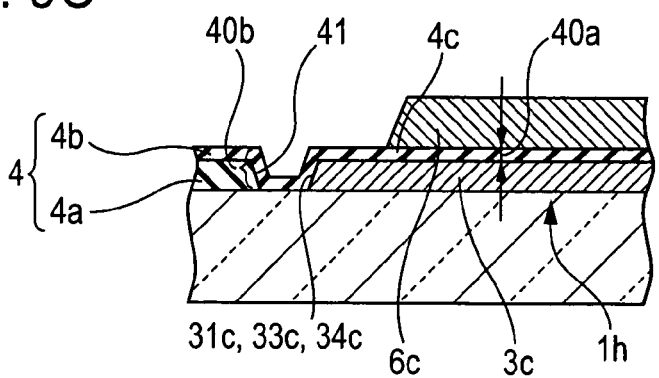
FIG. 9C shows one of regions overlapping with the lower electrodes and end portions of the upper electrodes, the lower and upper electrodes being included in the storage capacitors.

FIG. 8A shows one of pixels 1b disposed in an electro-optical device 1 according to a second embodiment of the present invention in plan view and FIG. 8B shows the pixel 1b in sectional view taken along the line VIIIB-VIIIB of FIG. 8A. FIG. 9A shows one of storage capacitors 1h disposed in the electro-optical device 1 shown in FIG. 8 in plan view in an enlarged manner, FIG. 9B shows one of regions overlapping with end portions of lower electrodes 3c and upper electrodes 6c in sectional view in an enlarged manner, and FIG. 9C shows one of regions overlapping with the lower electrodes 3c and end portions of the upper electrodes 6c in sectional view in an enlarged manner. With reference to FIG. 8A, pixel electrodes 2a are shown by thick broken lines, gate lines 3a and thin-films formed together therewith are shown by thin solid lines, source lines 6a and thin-films formed together therewith are shown by thin dotted-chain lines, and semiconductor layers 7a are shown by thin dotted lines. Furthermore, dielectric layers 4c of the storage capacitors 1h that are thin portions of a gate insulating layer 4 are shown by thick solid lines and contact holes as well as the gate lines 3a are shown by thin solid lines. With reference to FIG. 9A, one of regions overlapping with the lower electrodes 3c and the upper electrodes 6c is diagonally shaded. The electro-optical device 1 of this embodiment has substantially the same configuration as that of the electro-optical device 1 of the first embodiment; hence, components common to these devices have the same reference numerals and will not be described in detail.

In this embodiment as well as the first embodiment, as shown in FIGS. 8A, 8B, and 9A, an element substrate 10 has pixel regions 1e surrounded by the gate and source lines 3a and 6a. The pixel regions 1e have bottom-gate thin-film transistors 1c and the storage capacitors 1h. In the storage capacitors 1h, the lower electrodes 3c are projective portions of capacitor lines 3b and the upper electrodes 6c are extending portions of drain electrodes 6b. The gate insulating layer 4 as well as that described in the first embodiment has a two-layer structure and includes a lower gate insulating sublayer 4a made of silicon nitride and an upper gate insulating sublayer 4b, made of silicon nitride, having a thickness less than that of the lower gate insulating sublayer 4a.

In this embodiment as well as the first embodiment, the lower gate insulating sublayer 4a has openings 41 formed by removing the following regions from the lower gate insulating sublayer 4a in the thickness direction: regions overlapping with the lower and upper electrodes 3c and 6c of the storage capacitors 1h in plan view. In contrast, the upper gate insulating sublayer 4b has no opening. Therefore, the gate insulating layer 4 has thin portions 40a which are portions of the upper gate insulating sublayer 4b and which are located in the regions overlapping with the lower and upper electrodes 3c and 6c in plan view (regions overlapping with the openings 41 in plan view). The gate insulating layer 4 also has thick portions 40b in which the upper gate insulating sublayer 4b is disposed on the lower gate insulating sublayer 4a. That is, in the storage capacitors 1h, the thin portions 40a of the gate insulating layer 4 are used as the dielectric layers 4c.

In the storage capacitors 1h configured as described above, the extending portions (upper electrodes 6c) of the drain electrodes 6b have a rectangular shape and each overlap with a first end portion 31 of each projective portion (lower electrode 3c) of the capacitor lines 3b, the projective portion having a rectangular shape, the first end portion 31 corresponding to one side of the projective portion. With reference to FIG. 9B, the gate insulating layer 4 has stepped portions corresponding to the first end portions 31c of the lower electrodes 3c. Therefore, electric fields may be concentrated on the stepped portions of the gate insulating layer 4 or properties of the gate insulating layer 4 may be deteriorated due to the presence of the stepped portions.

In this embodiment, in order to prevent such problems, the openings 41 are each located in a region spaced inward from the first end portion 31c of each lower electrode 3c at a predetermined distance. Therefore, the thin portions 40a, which are the portions of the upper gate insulating sublayer 4b, occupy most of the regions overlapping with the lower and upper electrodes 3c and 6c and the thick portions 40b, in which the upper gate insulating sublayer 4b is disposed on the lower gate insulating sublayer 4a, are adjacent to regions overlapping with the upper electrodes 6c and the first end portions 31c of the lower electrodes 3c.

The lower electrodes 3c have second end portions 32c, third end portions 33c, and fourth end portions 34c in addition to the first end portions 31c. The upper electrodes 6c have end portions located inside the second, third, and fourth end portions 32c, 33c, and 34c. In this embodiment, the openings 41 extend outside the second, third, and fourth end portions 32c, 33c, and 34c. With reference to FIG. 9C, in the gate insulating layer 4, the thin portions 40a occupy most of the regions overlapping with the lower and upper electrodes 3c and 6c except the regions overlapping with the first end portions 31c of the lower electrodes 3c and the upper electrodes 6c. Other components of the electro-optical device 1 of this embodiment are substantially the same as those described in the first embodiment and are not described below.

The storage capacitors 1h of this embodiment have substantially the same configuration as that of the storage capacitors 1h of the first embodiment. Therefore, the storage capacitors 1h of this embodiment have high capacitance and the thin-film transistors 1c have high reliability. That is, the same advantages as those described in the first embodiment can be achieved in this embodiment.

In this embodiment, the thin portions 40a occupy most of the regions overlapping with the lower and upper electrodes 3c and 6c except the regions overlapping with the first end portions 31c of the lower electrodes 3c and the upper electrodes 6c and therefore have a large area. In regions other than the regions overlapping with the first end portions 31c of the lower electrodes 3c and the upper electrodes 6c, electric field concentration or the deterioration of layer properties does not occur in the end regions of the upper electrodes 6c; hence, the dielectric strength of the storage capacitors 1h is not reduced. Therefore, the capacitance per unit area of the storage capacitors 1h can be maximized in such a manner that the dielectric strength of the storage capacitors 1h is prevented from being reduced due to the stepped portions corresponding to the first end portions 31c of the lower electrodes 3c.

Figure 10:
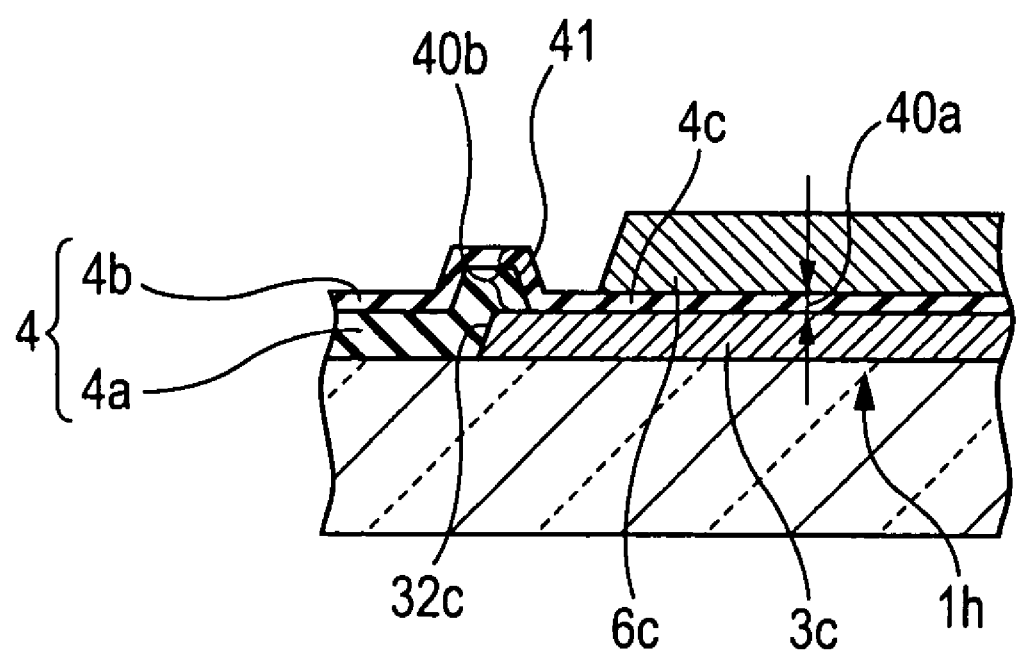
FIG. 10 is an enlarged sectional view of one of regions overlapping with lower electrodes and end portions of upper electrodes, the lower and upper electrodes being included in an electro-optical device according to a modification of the second embodiment.

A modification of the second embodiment will now be described. FIG. 10 shows one of regions overlapping with lower electrodes 3c and end portions of upper electrodes 6c in cross section in an enlarged manner, these lower and upper electrodes 3c and 6c being included in an electro-optical device according to the modification. In the second embodiment, those openings 41 extend outside the second, third, and fourth end portions 32c, 33c, and 34c of those lower electrodes 3c as shown in FIG. 9C. In the modification, openings 41 may be located inside second, third, and fourth end portions 32c, 33c, and 34c of these lower electrodes 3c and may extend outside the end portions of these upper electrodes 6c as shown in FIG. 10. Thin portions 40a occupy most of regions overlapping with these lower and upper electrodes 3c and 6c except regions overlapping with first end portions 31c of these lower electrodes 3c and these upper electrodes 6c. Hence, the capacitance per unit area of storage capacitors 1h included in this electro-optical device can be maximized.

Third Embodiment

Figure 11A:
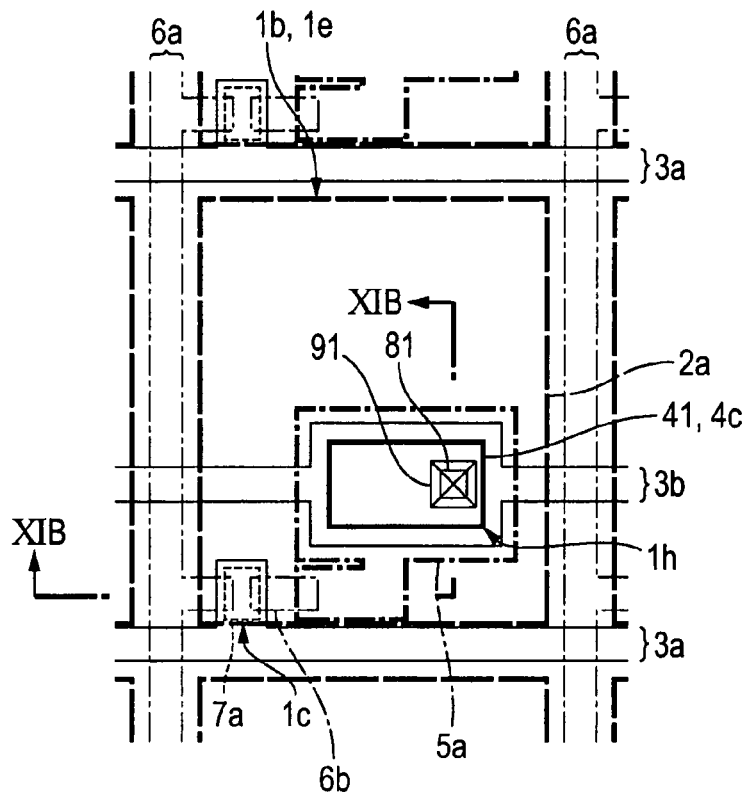
FIG. 11A is a plan view of one of pixels disposed in an electro-optical device according to a third embodiment of the present invention and FIG. 11B is a sectional view of the pixel taken along the line XIB-XIB of FIG. 11A.
Figure 11B:
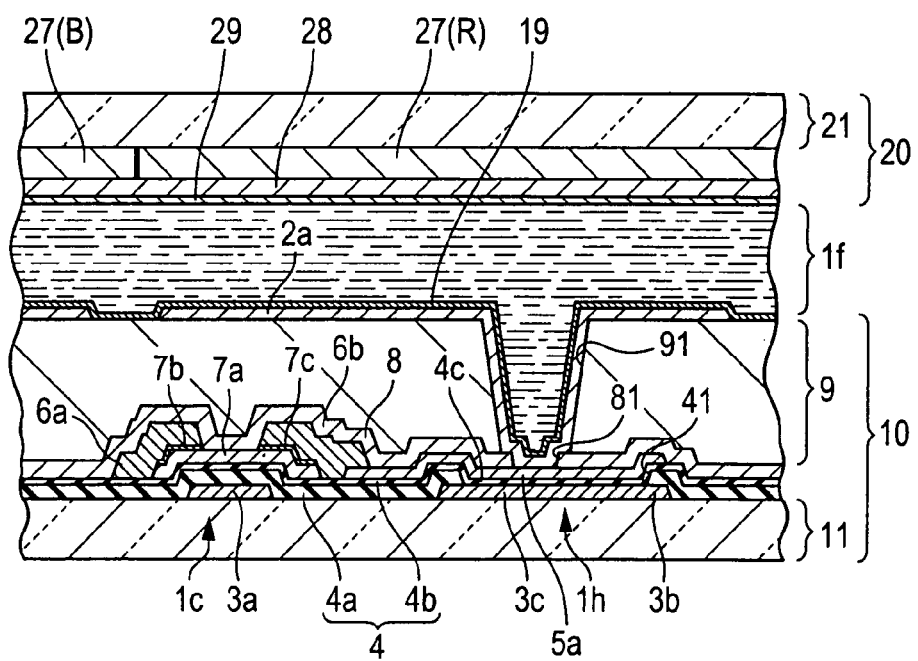

FIG. 11A shows one of pixels 1b disposed in an electro-optical device 1 according to a third embodiment of the present invention in plan view and FIG. 11B shows the pixel 1b in sectional view taken along the line XIB-XIB of FIG. 11A. With reference to FIG. 11A, pixel electrodes 2a are shown by thick broken lines, gate lines 3a and thin-films formed together therewith are shown by thin solid lines, source lines 6a and thin-films formed together therewith are shown by thin dotted-chain lines, and semiconductor layers 7a are shown by thin dotted lines. Furthermore, dielectric layers 4c of storage capacitors 1h that are thin portions of a gate insulating layer 4 are shown by thick solid lines and contact holes as well as the gate lines 3a are shown by thin solid lines. The electro-optical device 1 of this embodiment has substantially the same configuration as that of the electro-optical device 1 of the first embodiment; hence, components common to these devices have the same reference numerals and will not be described in detail.

In this embodiment as well as the first embodiment, as shown in FIGS. 11A and 11B, an element substrate 10 has pixel regions 1e surrounded by the gate and source lines 3a and 6a. The pixel regions 1e have bottom-gate thin-film transistors 1c and the storage capacitors 1h.

In this embodiment, the storage capacitors 1h as well as those described in the first embodiment include lower electrodes 3c that are projective portions of capacitor lines 3b. The storage capacitors 1h however include upper electrodes 5a including ITO layers disposed between the gate insulating layer 4 and drain electrodes 6b. The upper electrodes 5a partly overlap with the drain electrodes 6b and therefore are electrically connected to the drain electrodes 6b. The ITO layers have a thickness of about 50 nm. The pixel electrodes 2a are arranged on a planarization layer 9 and are electrically connected to the upper electrodes 5a through first and second contact holes 81 and 91 present in the planarization layer 9.

The gate insulating layer 4 as well as that described in the first embodiment has a two-layer structure and includes a lower gate insulating sublayer 4a made of silicon nitride and an upper gate insulating sublayer 4b, made of silicon nitride, having a thickness less than that of the lower gate insulating sublayer 4a. The lower gate insulating sublayer 4a has openings 41 formed by removing the following regions from the lower gate insulating sublayer 4a in the thickness direction: regions overlapping with the lower and upper electrodes 3c and 5a of the storage capacitors 1h in plan view.

In the storage capacitors 1h configured as described above, the upper electrodes 5a extend out of the projective portions (lower electrodes 3c) of the capacitor lines 3b in all directions and therefore overlap with four end portions of the lower electrodes 3c, the projective portions having a rectangular shape. Therefore, in this embodiment as well as the first embodiment, the openings 41 are located in regions spaced inward from end portions of regions overlapping with the lower electrodes 3c and the upper electrodes 5a at a predetermined distance and thick portions 40b in which the upper gate insulating sublayer 4b is disposed on the lower gate insulating sublayer 4a are adjacent to regions overlapping with the upper electrodes 5a and the end portions of the lower electrode 3c. Other components of the electro-optical device 1 of this embodiment are substantially the same as those described in the first embodiment and are not described below. In this embodiment, since the upper electrodes 5a include the ITO layers, which are transparent, these pixels 1b have a higher aperture ratio as compared to those pixels 1b in which the extending portions of those drain electrodes 6b are used as those upper electrodes 6c.

Fourth Embodiment

Figure 12A:
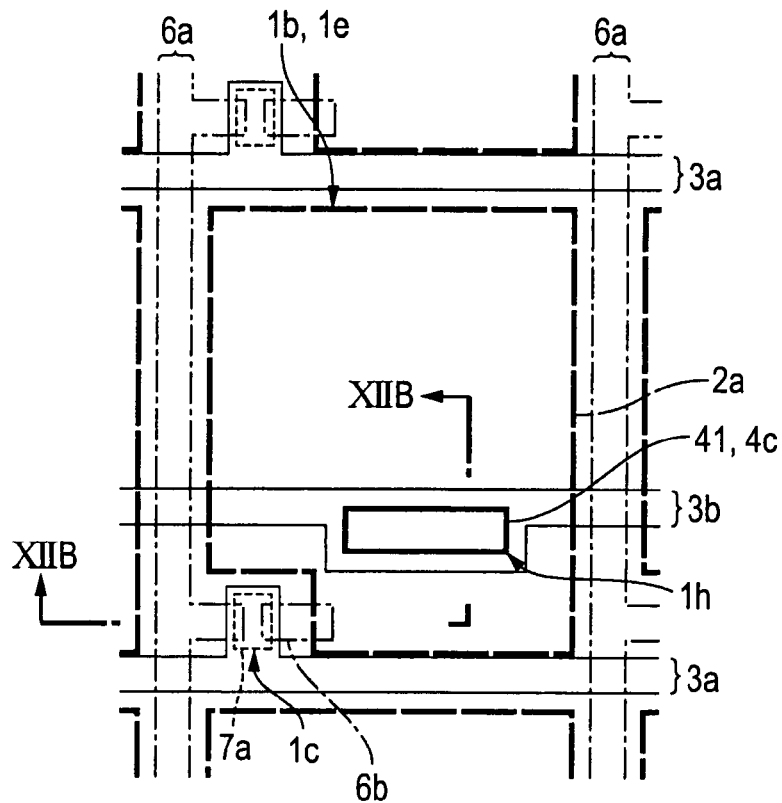
FIG. 12A is a plan view of one of pixels disposed in an electro-optical device according to a fourth embodiment of the present invention and FIG. 12B is a sectional view of the pixel taken along the line XIIIB-XIIIB of FIG. 12A.
Figure 12B:
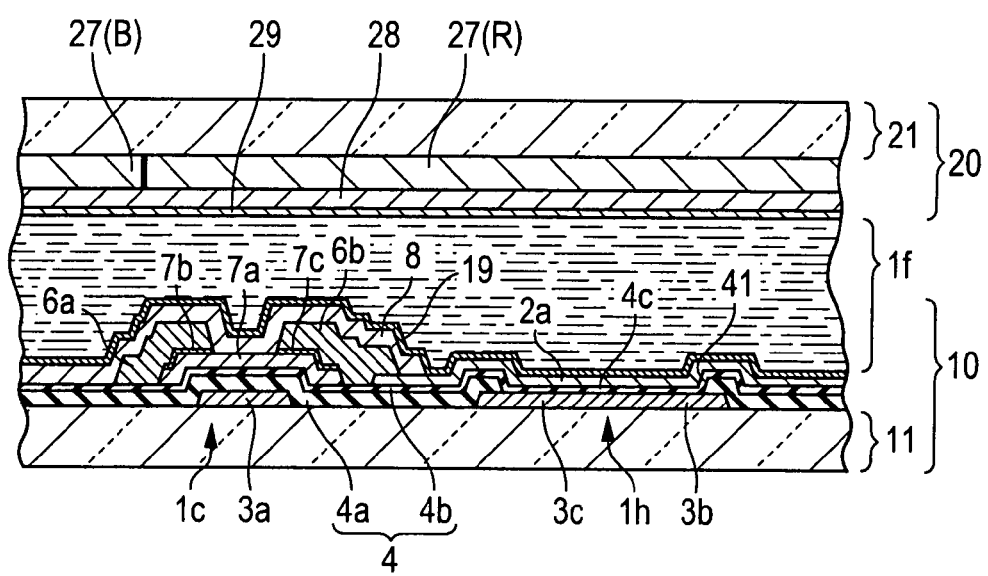

FIG. 12A shows one of pixels 1b disposed in an electro-optical device 1 according to a fourth embodiment of the present invention in plan view and FIG. 12B shows the pixel 1b in sectional view taken along the line XIIB-XIIB of FIG. 12A. With reference to FIG. 12A, pixel electrodes 2a are shown by thick broken lines, gate lines 3a and thin-films formed together therewith are shown by thin solid lines, source lines 6a and thin-films formed together therewith are shown by thin dotted-chain lines, and semiconductor layers 7a are shown by thin dotted lines. Furthermore, dielectric layers 4c of storage capacitors 1h that are thin portions of a gate insulating layer 4 are shown by thick solid lines. The electro-optical device 1 of this embodiment has substantially the same configuration as that of the electro-optical device 1 of the first embodiment; hence, components common to these devices have the same reference numerals and will not be described in detail.

In this embodiment as well as the first embodiment, as shown in FIGS. 12A and 12B, an element substrate 10 has pixel regions 1e surrounded by the gate and source lines 3a and 6a. The pixel regions 1e have bottom-gate thin-film transistors 1c and the storage capacitors 1h. However, this embodiment is different from the first to third embodiments in that the electro-optical device 1 includes no planarization layer and the pixel electrodes 2a are disposed between the gate insulating layer 4 and drain electrodes 6b. The pixel electrodes 2a partly overlap with the drain electrodes 6b and therefore are electrically connected to the drain electrodes 6b.

The storage capacitors 1h is similar to that of the first embodiment in that lower electrodes 3c of the storage capacitors 1h are projective portions of capacitor lines 3b. However, upper electrodes of the storage capacitors 1h are portions of the pixel electrodes 2a that overlap with the lower electrodes 3c in plan view.

The gate insulating layer 4 as well as that of the first embodiment has a two-layer structure and includes a lower gate insulating sublayer 4a made of silicon nitride and an upper gate insulating sublayer 4b, made of silicon nitride, having a thickness less than that of the lower gate insulating sublayer 4a. The lower gate insulating sublayer 4a has openings 41 formed by removing the following regions from the lower gate insulating sublayer 4a in the thickness direction: regions overlapping with the pixel electrodes 2a and the lower electrodes 3c of the storage capacitors 1h in plan view. Therefore, the dielectric layers 4c of the storage capacitors 1h are the thin portions of the gate insulating layer 4 (portions of the lower gate insulating sublayer 4a).

In the storage capacitors 1h configured as described above, the pixel electrodes 2a (upper electrodes) extend out of the projective portions (lower electrodes 3c) of the capacitor lines 3b and therefore overlap with four end portions of the lower electrodes 3c, the projective portions having a rectangular shape. Therefore, in this embodiment as well as the first embodiment, the openings 41 are located in regions spaced inward from end portions of regions overlapping with the lower electrodes 3c and the pixel electrodes 2a at a predetermined distance and thick portions in which the upper gate insulating sublayer 4b is disposed on the lower gate insulating sublayer 4a are adjacent to regions overlapping with the pixel electrodes 2a and the end portions of the lower electrode 3c. Other components of the electro-optical device 1 of this embodiment are substantially the same as those described in the first embodiment and are not described below.

Fifth Embodiment

Figure 13A:
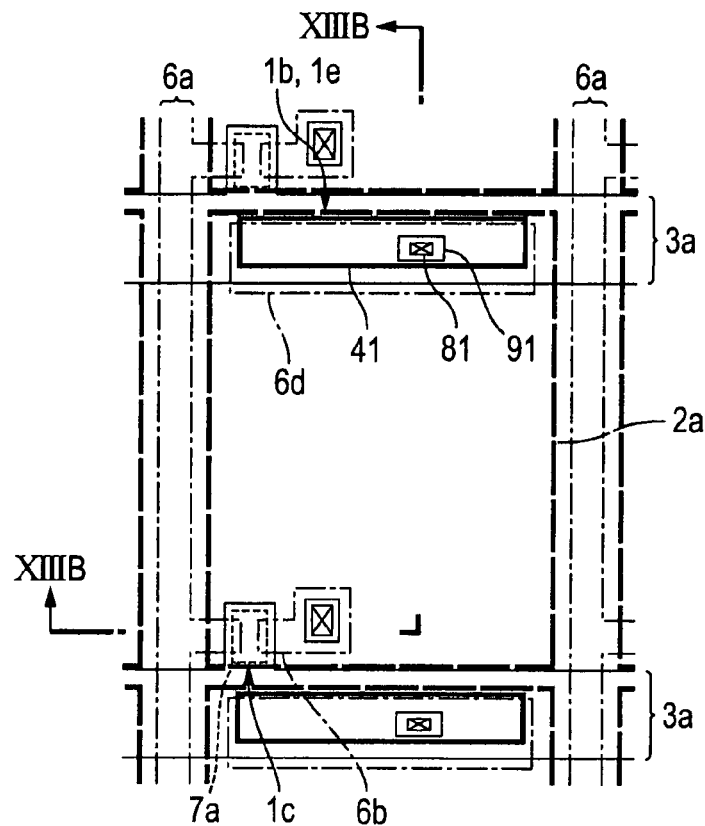
FIG. 13A is a plan view of one of pixels disposed in an electro-optical device according to a fifth embodiment of the present invention and FIG. 13B is a sectional view of the pixel taken along the line XIIIB-XIIIB of FIG. 13A.
Figure 13B:
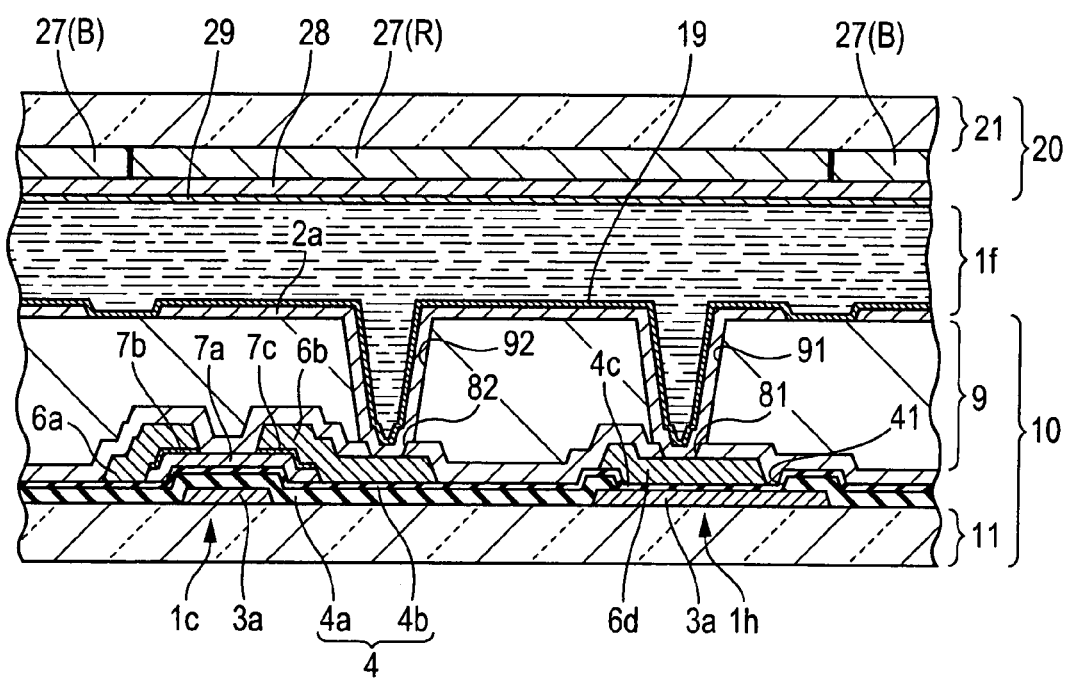

FIG. 13A shows one of pixels 1b disposed in an electro-optical device 1 according to a fifth embodiment of the present invention in plan view and FIG. 13B shows the pixel 1b in sectional view taken along the line XIIIB-XIIIB of FIG. 13A. With reference to FIG. 13A, pixel electrodes 2a are shown by thick broken lines, gate lines 3a and thin-films formed together therewith are shown by thin solid lines, source lines 6a and thin-films formed together therewith are shown by thin dotted-chain lines, and semiconductor layers 7a are shown by thin dotted lines. Furthermore, dielectric layers 4c of storage capacitors 1h that are thin portions of a gate insulating layer 4 are shown by thick solid lines and contact holes as well as the gate lines 3a are shown by thin solid lines. The electro-optical device 1 of this embodiment has substantially the same configuration as that of the electro-optical device 1 of the first embodiment; hence, components common to these devices have the same reference numerals and will not be described in detail.

In this embodiment as well as the first embodiment, as shown in FIGS. 13A and 13B, an element substrate 10 has pixel regions 1e surrounded by the gate and source lines 3a and 6a. The pixel regions 1e have bottom-gate thin-film transistors 1c and the storage capacitors 1h. However, this embodiment is different from the first to fourth embodiments in that the electro-optical device 1 includes no capacitor lines and lower electrodes 3c of the storage capacitors 1h are portions of the gate lines 3a that are located on the front side of the storage capacitors 1h when viewed in a scanning direction (the direction perpendicular to the longitudinal direction of the gate lines 3a, that is, the longitudinal direction of the source lines 6a).

The storage capacitors 1h include upper electrodes 6d disposed in regions overlapping with the lower electrodes 3c. In this embodiment, the upper electrodes 6d are formed together with the source lines 6a and drain electrodes 6b by processing a metal layer. The upper electrodes 6d are spaced from the drain electrodes 6b. The pixel electrodes 2a are arranged on a planarization layer 9. The pixel electrodes 2a are electrically connected to the upper electrodes 6d through first contact holes 81 present in a passivation layer 8 and second contact holes 91 present in the planarization layer 9 and also connected to the drain electrodes 6b through third contact holes 82 present in the passivation layer 8 and fourth contact holes 92 present in the planarization layer 9.

The gate insulating layer 4 as well as that of the first embodiment has a two-layer structure and includes a lower gate insulating sublayer 4a made of silicon nitride and an upper gate insulating sublayer 4b, made of silicon nitride, having a thickness less than that of the lower gate insulating sublayer 4a. The lower gate insulating sublayer 4a has openings 41 formed by removing the following regions from the lower gate insulating sublayer 4a in the thickness direction: regions overlapping with the lower upper electrodes 3c and 6d of the storage capacitors 1h in plan view. Therefore, the dielectric layers 4c of the storage capacitors 1h are the thin portions of the gate insulating layer 4 (portions of the lower gate insulating sublayer 4a).

In the storage capacitors 1h configured as described above, the upper electrodes 6d each overlap with an front end portion of each gate line 3a that corresponds to one side of the gate line 3a. Therefore, in this embodiment as well as the first embodiment, the openings 41 are located in regions spaced inward from regions overlapping with the front end portions of the lower electrodes 3c and the upper electrodes 6d at a predetermined distance and thick portions in which the upper gate insulating sublayer 4b is disposed on the lower gate insulating sublayer 4a are adjacent to the regions overlapping with the front end portions of the lower electrode 3c and the upper electrodes 6d. Other components of the electro-optical device 1 of this embodiment are substantially the same as those described in the first embodiment and are not described below.

Other Embodiments

In the above embodiments, the lower and upper gate insulating sublayers 4a and 4b of each gate insulating layer 4 are made of the same insulating material. The lower and upper gate insulating sublayers 4a and 4b may be made of different insulating materials. If silicon dioxide and silicon nitride are used to form the gate insulating layer 4, the upper gate insulating sublayer 4b is preferably made of silicon nitride because silicon nitride has a high dielectric constant and portions of the upper gate insulating sublayer 4b are used as the dielectric layers 4c. The lower and upper gate insulating sublayers 4a and 4b have a single-layer structure. The lower and upper gate insulating sublayers 4a and 4b may have a multilayer structure.

In the above embodiments, the gate lines 3a include the aluminum alloy layers and the molybdenum layers, that is, the gate lines 3a have a multilayer structure. The source lines 6a include the aluminum layers and the molybdenum layers, that is, the gate lines 3a have a multilayer structure. The gate lines 3a and the source lines 6a may include other metal layers or conductive layers such as silicide layers. The semiconductor layers 7a are made of intrinsic amorphous silicon. The semiconductor layers 7a may be made of another type of silicon or a transparent semiconductor material such as an organic semiconductor material or zinc oxide.

In the above embodiments, each lower gate insulating sublayer 4a is partly removed and portions of each upper gate insulating sublayer 4b are used as the dielectric layers 4c. Each gate insulating layer 4 may be partly removed in the thickness direction thereof by etching so as to have thin portions. Alternatively, an electro-optical device according to another embodiment of the present invention may be configured as shown in FIGS. 14A to 14E. In the electro-optical device, an upper gate insulating sublayer 4b is partly removed such that portions of a lower gate insulating sublayer 4a are used as dielectric layers 4c.

Figure 14A:
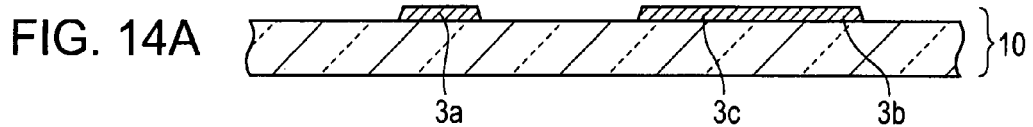
FIGS 14A to 14E are sectional views showing steps of preparing an element substrate included in an electro-optical device according to another embodiment of the present invention.
Figure 14B:
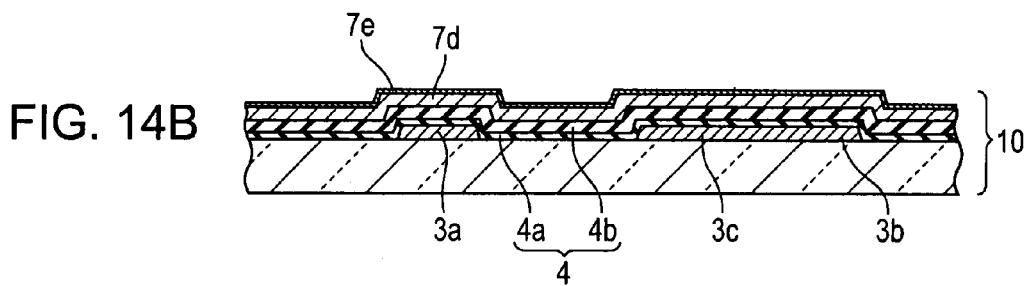
Figure 14C:
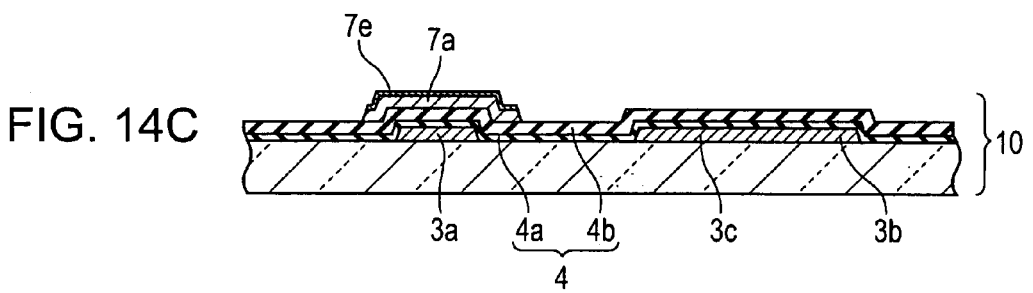
Figure 14D:
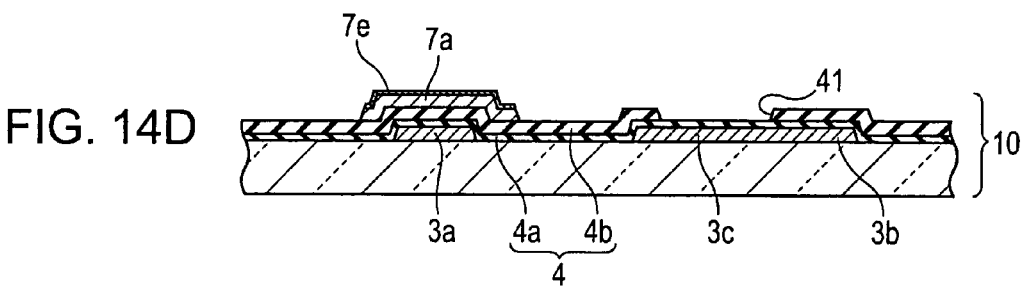
Figure 14E:
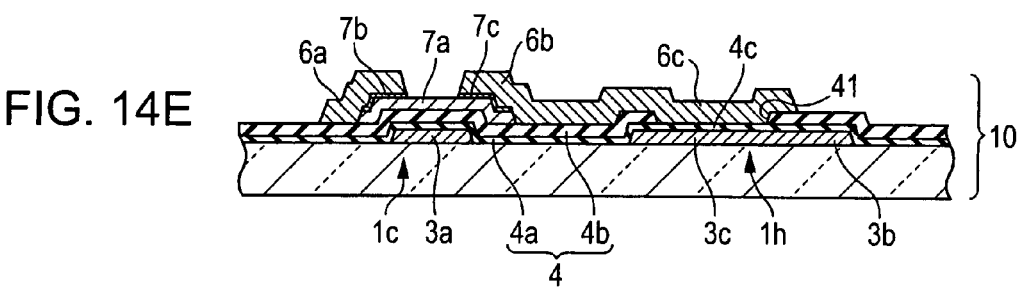

As shown in FIG. 14A, gate lines 3a (gate electrodes) are formed together with lower electrodes 3c (portions of capacitor lines 3b). As shown in FIG. 14B, the lower gate insulating sublayer 4a and the upper gate insulating sublayer 4b are formed over the gate lines 3a and the lower electrodes 3c in that order, whereby an gate insulating layer 4 is formed. An amorphous silicon layer 7d for forming active layers and an n⁺ silicon layer 7e for forming contact layers are formed on the gate insulating layer 4 in that order. As shown in FIG. 14C, the amorphous silicon layer 7d and the n⁺ silicon layer 7e are etched, whereby a dotted pattern is formed. As shown in FIG.

14D, portions of the gate insulating layer 4 that overlap with the lower electrodes 3c are etched such that the upper gate insulating sublayer 4b is partly removed, whereby openings 41 are formed in the upper gate insulating sublayer 4b. A conductive layer is formed on the upper gate insulating sublayer 4b and then etched, whereby source electrodes (source lines 6a) and drain electrodes 6b are formed. The n$^+$ silicon layer 7e is etched, whereby first ohmic contact layers 7b and second ohmic contact layers 7c are formed. This results in the formation of thin-film transistors 1c and storage capacitors 1h. In the storage capacitors 1h, portions of the lower gate insulating sublayer 4a are used as the dielectric layers 4c as described above and extending portions of the drain electrodes 6b are used as upper electrodes 6c.

The electro-optical device 1 of the above embodiments are the transmissive active matrix liquid crystal devices operating in the TN mode, the ECB mode, or the VAN mode as described above and may be a transflective or reflective liquid crystal device operating in an in-plane switching (IPS) mode.

An electro-optical device according to another embodiment of the present invention is not limited to such a liquid crystal device and may be an organic electroluminescent (EL) device. In the organic EL device, the following components are arranged in pixel regions disposed on an element substrate holding organic EL layers containing an electro-optical substance: thin-film transistors, pixel electrodes electrically connected to the thin-film transistors, and storage capacitors including lower electrodes located under a gate insulating layer for forming the thin-film transistors.

Sixth Embodiment

Figure 15:
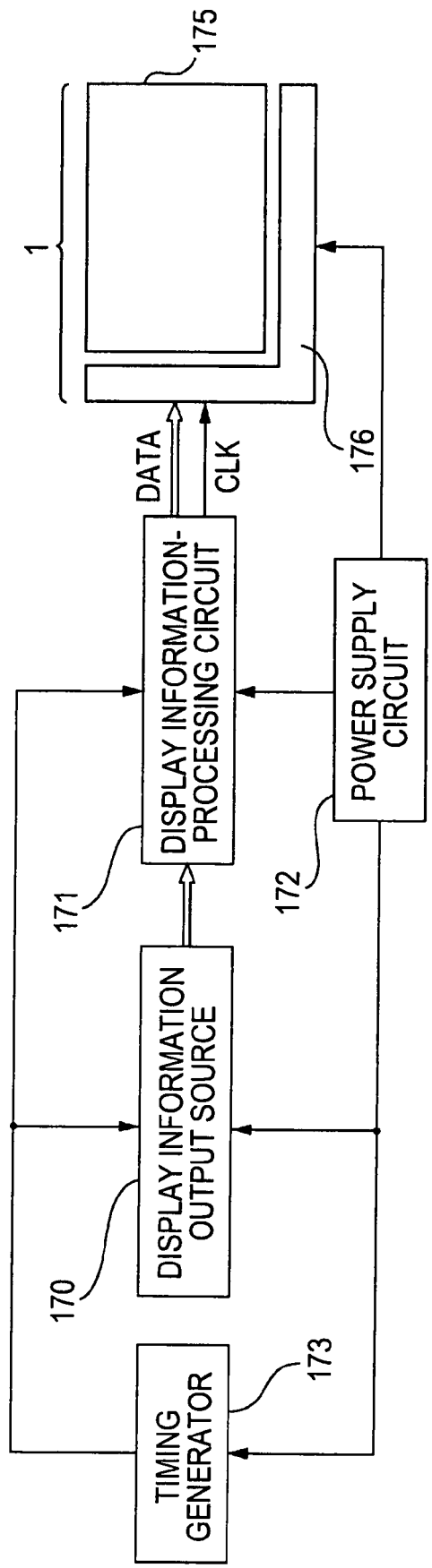
FIG. 15 is an illustration of an electronic apparatus including the electro-optical device according to any one of the above embodiments, the electro-optical device being used as a display.

FIG. 15 shows an electronic apparatus according to a sixth embodiment of the present invention. Examples of the electronic apparatus include personal computers and mobile phones. The electronic apparatus includes a display information output source 170, a display information-processing circuit 171, a power supply circuit 172, a timing generator 173, and an electro-optical device 1. The electro-optical device 1 is used as a display and includes a panel 175 and a driving circuit 176. The electro-optical device 1 may be one according to any one of the above embodiments. The display information output source 170 includes a memory such as a read-only memory (ROM) or a random access memory (RAM), storage units such as disks, and a synchronous circuit for outputting synchronous digital image signals and supplies display information containing image signals having a predetermined format to the display information-processing circuit 171 on the basis of various clock signals CLK generated by the timing generator 173. The display information-processing circuit 171 includes various known subcircuits such as a serial/parallel conversion subcircuit, an amplification/inversion subcircuit, a rotation subcircuit, a gamma-correction circuit, and a clamp circuit and processes input display signals to supply the image signals and the clock signals CLK to the driving circuit 176. The power supply circuit 172 supplies predetermined voltages to components of the electronic apparatus.

The entire disclosure of Japanese Patent Application No. 2006-121642, filed Apr. 26, 2006 is expressly incorporated by reference herein.

What is claimed is:

1. An electro-optical device comprising:
an element substrate having a plurality of pixel regions;
thin-film transistors, arranged in the pixel regions, including gate electrodes, portions of a gate insulating layer, and semiconductor layers;
pixel electrodes electrically connected to drain regions of the thin-film transistors; and
storage capacitors including lower electrodes and upper electrodes that are opposed to the lower electrodes with insulating layers disposed therebetween, the insulating layers being made of the same material as that for forming the gate insulating layer,
wherein the upper electrodes overlap with some of end portions of the lower electrodes and the gate insulating layer has thin portions located in inner portions of regions overlapping with the lower and upper electrodes and thick portions which are located in regions overlapping with the upper electrodes and the end portions of the lower electrodes and which have a thickness greater than that of the thin portions, and
the thick portions extend inward from the end portions of the lower electrodes and have a width greater than the thickness of the thick portions.

2. The electro-optical device according to claim 1, wherein the gate electrodes, the gate insulating layer portions, and the semiconductor layers are arranged in the thin-film transistors in that order.

3. The electro-optical device according to claim 1, wherein the thin portions are located outside the regions overlapping with the upper electrodes and the end portions of the lower electrodes.

4. The electro-optical device according to claim 1, wherein the gate insulating layer includes a lower gate insulating sublayer including one or more insulating layer sections and a upper gate insulating sublayer including one or more insulating layer sections, the thin portions are formed by partly removing the lower gate insulating sublayer, and the thick portions correspond to portions in which the upper gate insulating sublayer is disposed on the lower gate insulating sublayer.

5. The electro-optical device according to claim 4, wherein the lower gate insulating sublayer includes an insulating layer section and the upper gate insulating sublayer includes an insulating layer section.

6. The electro-optical device according to claim 1, wherein the semiconductor layers are made of amorphous silicon.

* * * * *